US 10,549,981 B2

(12) United States Patent
Takimoto et al.

(10) Patent No.: US 10,549,981 B2
(45) Date of Patent: Feb. 4, 2020

(54) MIRROR DRIVE DEVICE AND METHOD FOR PRODUCING SAME

(71) Applicant: HAMAMATSU PHOTONICS K.K., Hamamatsu-shi, Shizuoka (JP)

(72) Inventors: Sadaharu Takimoto, Hamamatsu (JP); Shinya Iwashina, Hamamatsu (JP); Masakuni Kimoto, Hamamatsu (JP); Yuki Morinaga, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 300 days.

(21) Appl. No.: 15/316,549

(22) PCT Filed: Jun. 10, 2015

(86) PCT No.: PCT/JP2015/066752
§ 371 (c)(1),
(2) Date: Dec. 6, 2016

(87) PCT Pub. No.: WO2016/002453
PCT Pub. Date: Jan. 7, 2016

(65) Prior Publication Data
US 2018/0148314 A1    May 31, 2018

(30) Foreign Application Priority Data
Jun. 30, 2014    (JP) ................. 2014-133698

(51) Int. Cl.
*G02B 26/08*    (2006.01)
*B81B 3/00*    (2006.01)
(Continued)

(52) U.S. Cl.
CPC .............. *B81B 3/001* (2013.01); *B81C 3/001* (2013.01); *G02B 26/085* (2013.01); *G02B 26/101* (2013.01); *G02B 7/1821* (2013.01)

(58) Field of Classification Search
None
See application file for complete search history.

(56) References Cited

U.S. PATENT DOCUMENTS

2002/0130561 A1    9/2002    Temesvary et al.
2005/0099671 A1    5/2005    Matsuo et al.
(Continued)

FOREIGN PATENT DOCUMENTS

JP    H11-231252 A    8/1999
JP    2002-040355 A    2/2002
(Continued)

OTHER PUBLICATIONS

International Preliminary Report on Patentability dated Jan. 12, 2017 for PCT/JP2015/066752.
(Continued)

*Primary Examiner* — Darryl J Collins
*Assistant Examiner* — Journey F Sumlar
(74) *Attorney, Agent, or Firm* — Drinker Biddle & Reath LLP

(57) ABSTRACT

A mirror drive device includes a support part, a movable part, a permanent magnet forming a magnetic field in the periphery of the movable part, and a circuit board disposed between the support part and the permanent magnet in a facing direction of a pair of principal surfaces of the movable part so as to cause the movable part to be positioned at an inside of the circuit board when viewed in the facing direction. The movable part includes a mirror disposition portion, a mirror disposed and a drive coil so as to face the permanent magnet. The support part includes a base portion connected to a connection member and a reinforcing portion extending from the base portion toward a side away from the permanent magnet and the circuit board. The drive coil is connected to electrodes by lead-out conductors.

28 Claims, 22 Drawing Sheets

(51) Int. Cl.
*G02B 26/10* (2006.01)
*B81C 3/00* (2006.01)
*G02B 7/182* (2006.01)

(56) References Cited

U.S. PATENT DOCUMENTS

| | | | |
|---|---|---|---|
| 2010/0208322 A1 | 8/2010 | Borchers | |
| 2014/0185117 A1* | 7/2014 | Hino | G02B 26/101 |
| | | | 359/199.3 |

FOREIGN PATENT DOCUMENTS

| | | |
|---|---|---|
| JP | 2004-102267 A | 4/2004 |
| JP | 2005-164859 A | 6/2005 |
| JP | 2006-293325 | 10/2006 |
| JP | 2008-122955 | 5/2008 |
| JP | 2008-181127 | 8/2008 |
| JP | 2010-169948 | 8/2010 |
| JP | 2013-174775 A | 9/2013 |

OTHER PUBLICATIONS

Yoshiyuki Watanabe, et al., "Electromagnetically driven two-axis optical beam steering MEMS mirror and its dependence of actuation on magnetic field", Electronics and Communications in Japan, vol. 94., No. 11, Nov. 1, 2011, p. 24-p. 31, XP001570681.

* cited by examiner

Fig.9
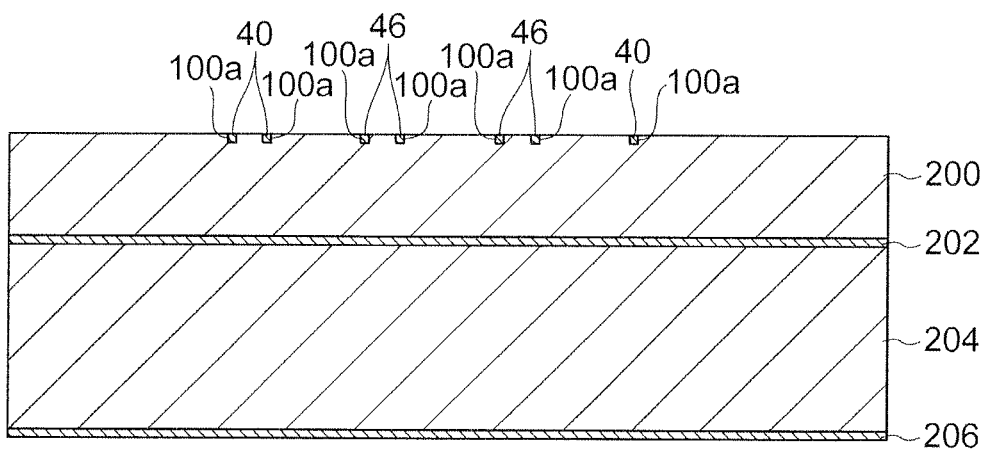
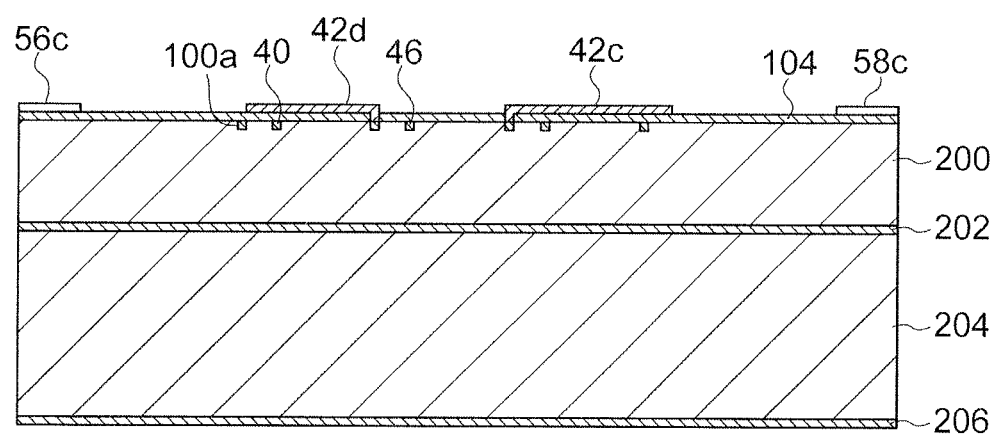
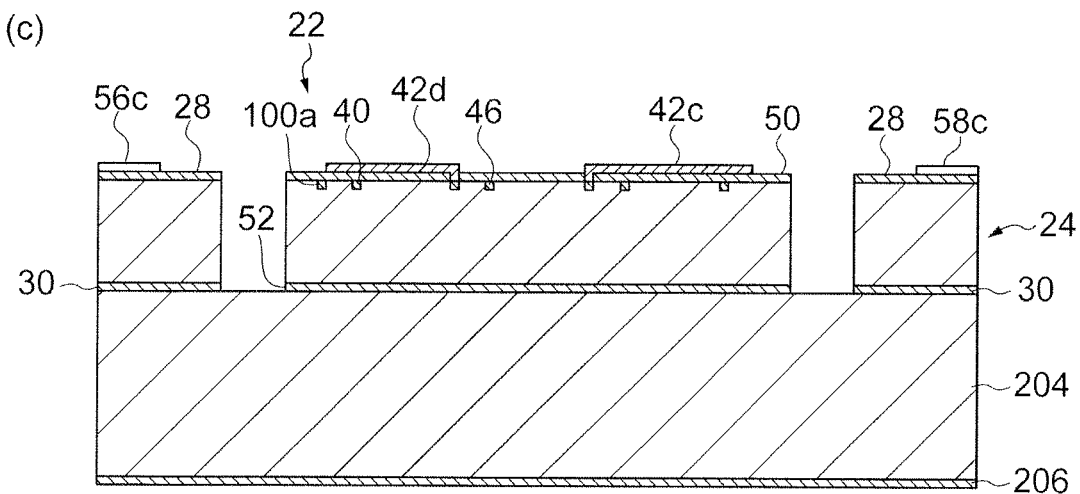

*Fig.13*
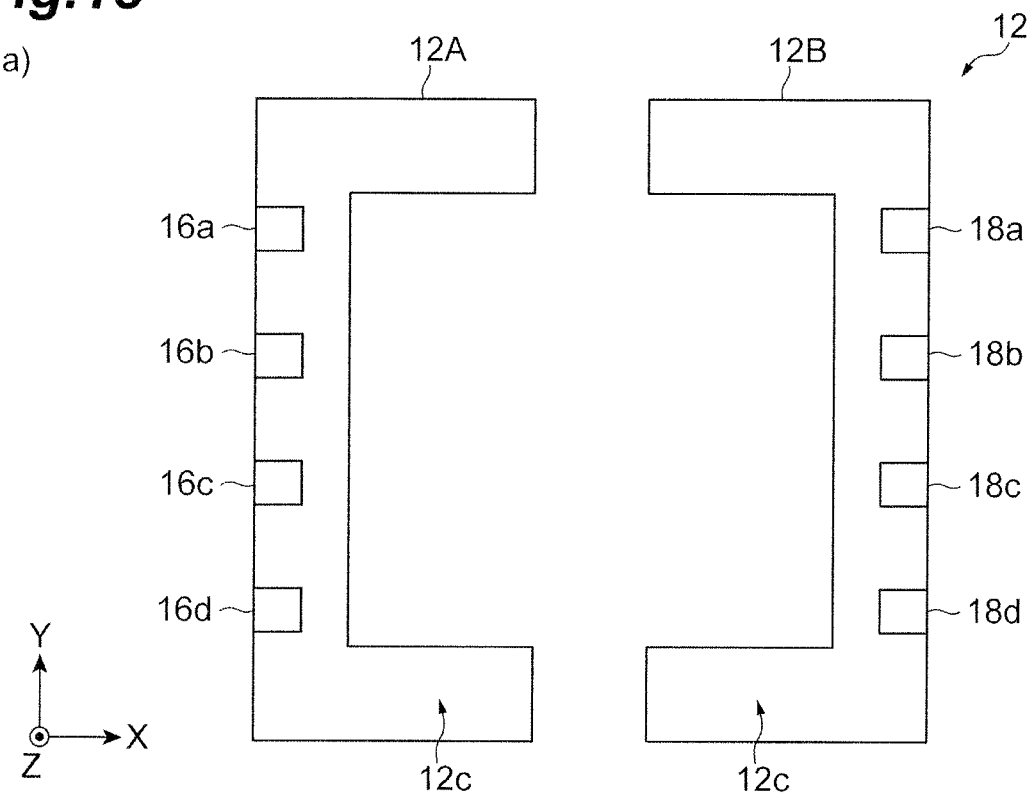
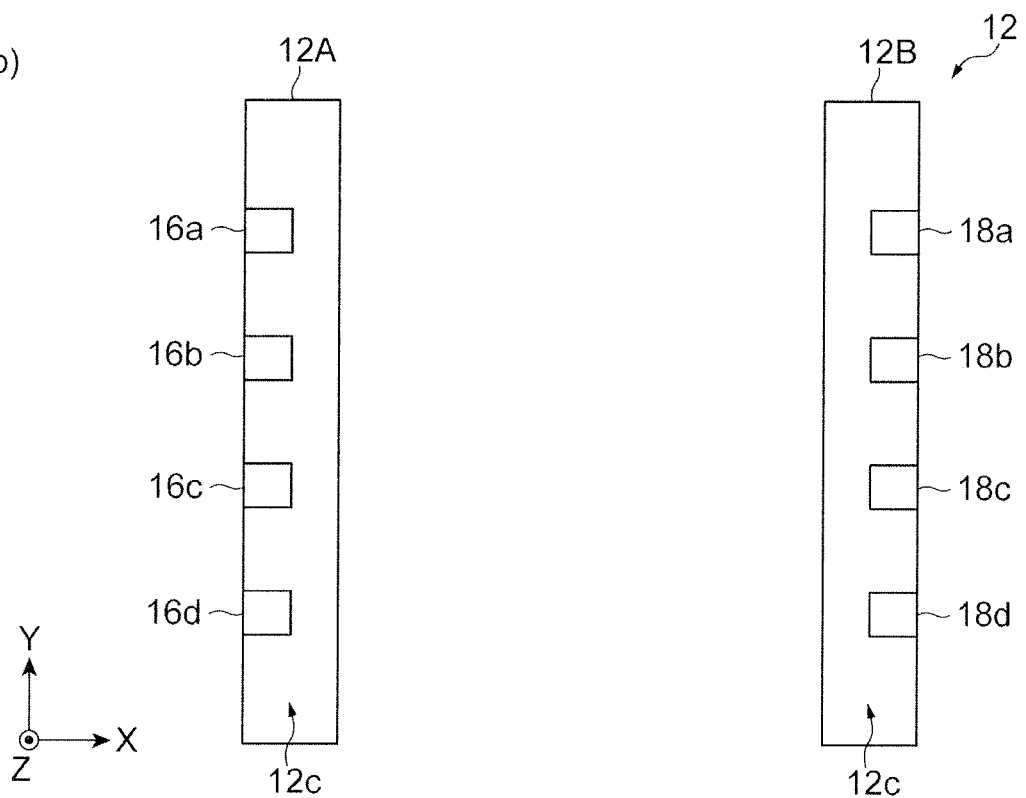

*Fig.19*
(a)
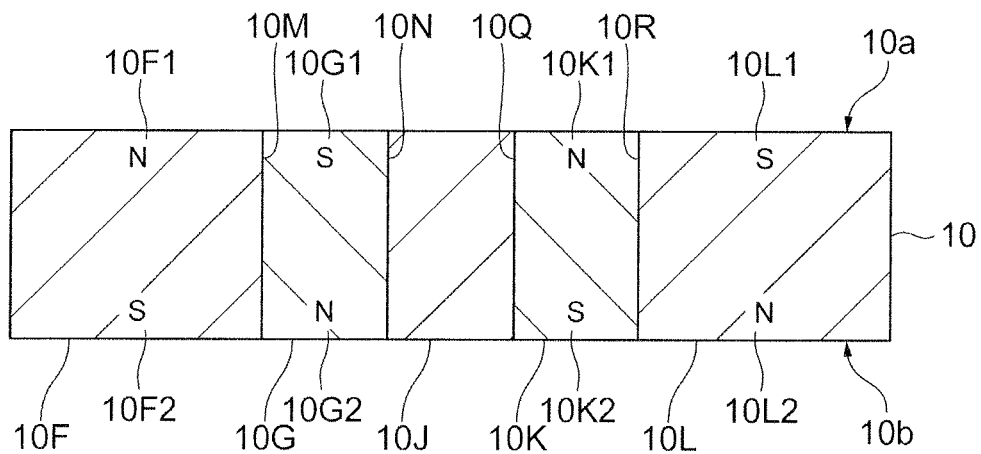
(b)
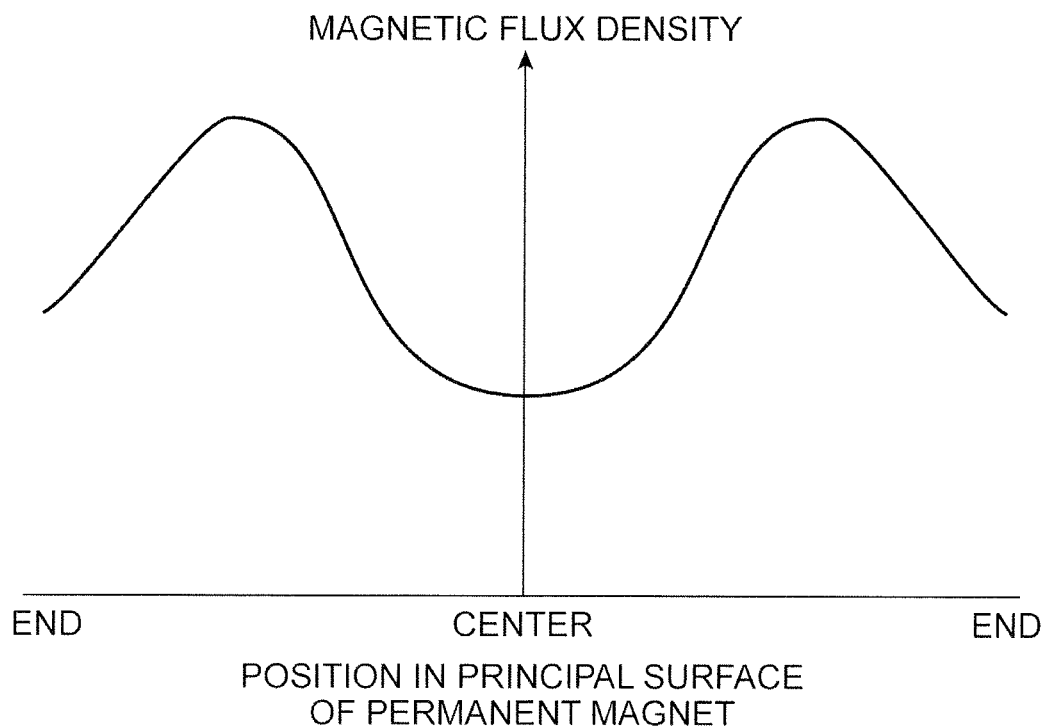

Fig.20
(a)
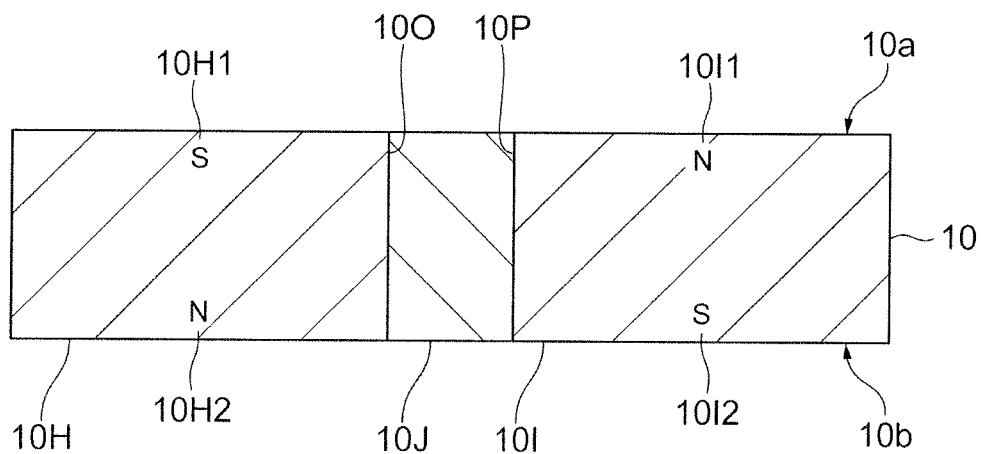
(b)
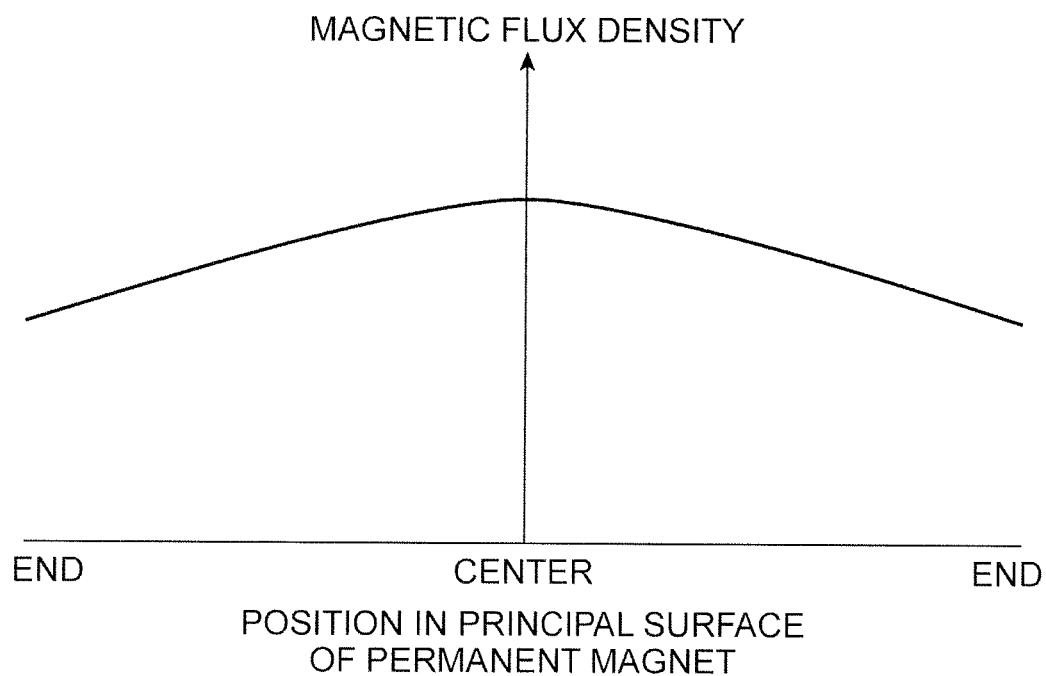

Fig.21
(a)
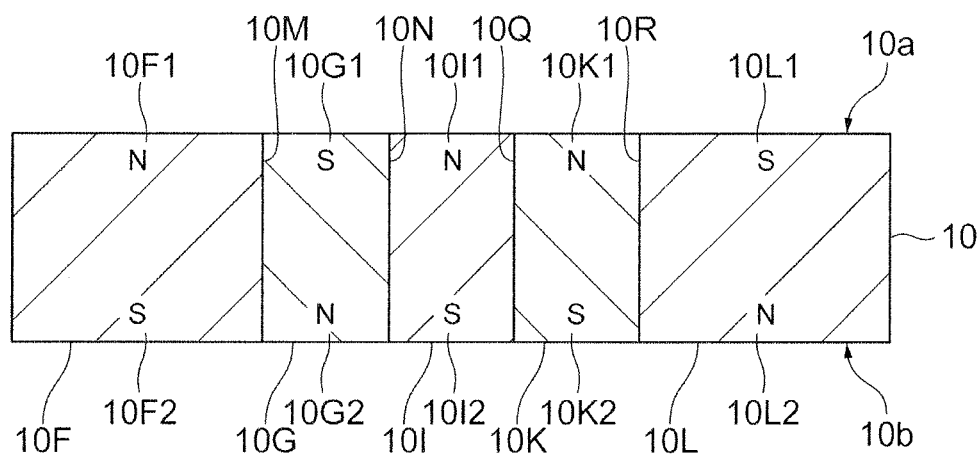
(b)
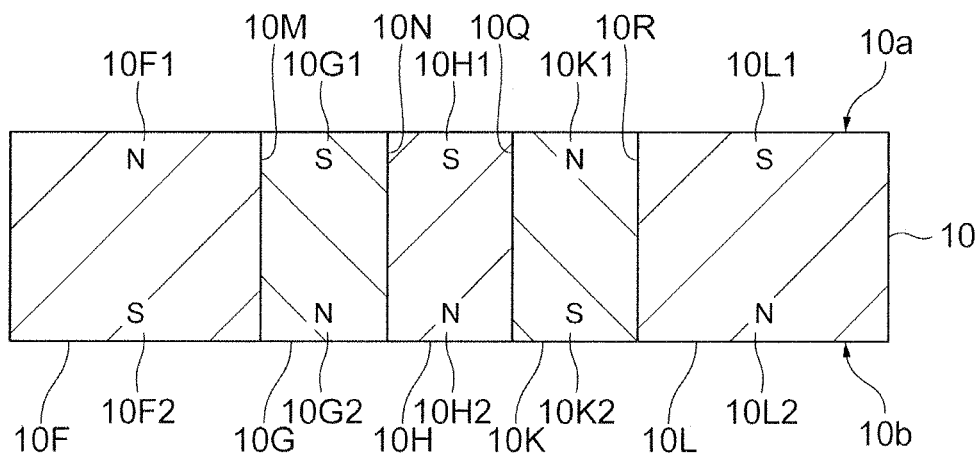

MIRROR DRIVE DEVICE AND METHOD FOR PRODUCING SAME

TECHNICAL FIELD

This disclosure relates to a mirror drive device and a method for producing the same.

BACKGROUND ART

In recent years, research on a mirror drive device which uses a MEMS (Micro Electro Mechanical System) technology (also called micromachine technology) in which mechanical elements and electronic circuit elements with minute sizes are integrated has been actively carried out. Patent Literatures 1 and 2 disclose examples of an electromagnetic mirror drive device.

For example, the mirror drive device disclosed in Patent Literature 2 includes a support part, a movable part, a mirror, a drive coil, and a pair of permanent magnets. The support part supports the movable part so as to be oscillated via a connection member. The mirror is disposed on the surface of the movable part. The drive coil is disposed in the surface of the movable part on the same side as the mirror or in the back surface which is a surface on a side opposite to the mirror. The pair of permanent magnets are disposed with the movable part interposed therebetween in a direction intersecting the normal line direction of the surface of the movable part.

When current flows through the drive coil, a Lorentz force is generated in the drive coil by an interaction with a magnetic field generated in the periphery of the movable part by the pair of permanent magnets, such that the movable part is oscillated. When the movable part is oscillated, the orientation of the mirror disposed in the surface of the movable part is changed, and an optical path of reflected light from the mirror is changed. This mirror drive device is applied to, for example, an optical switch for optical communication or an optical seamier.

CITATION LIST

Patent Literature

[Patent Literature 1] Japanese Unexamined Patent Publication No. 2002-040355
[Patent Literature 2] Japanese Unexamined Patent Publication No. H11-231252

SUMMARY OF INVENTION

Technical Problem

In a case where the drive coil is disposed in the back surface of the movable part, the following advantages are obtained. That is, since the drive coil is not disposed in the surface of the movable part on the same side as the mirror, (1) the mirror can be formed with a large size, and (2) a flat mirror can be formed while the mirror is not affected by uneven portions of the drive coil.

However, as in the mirror drive device described in Patent Literature 2, when the movable part is disposed between the pair of permanent magnets in the direction intersecting the normal line direction of the surface of the movable part, the distance between the permanent magnets and the drive coil formed in the movable part tends to increase, and there may be a case where a sufficiently large magnetic field is not exerted on the drive coil. Therefore, it is desired that the permanent magnet is caused to become close to the drive coil in order to exert a larger magnetic field on the drive coil. Therefore, it may be considered to employ a single permanent magnet which is disposed to overlap the support part and the movable part when viewed in the normal line direction of the surface of the movable part. In this case, the permanent magnet and the movable part are adjacent to each other in the normal line direction, and the permanent magnet as a whole becomes close to the drive coil. Therefore, a larger magnetic field can be exerted on the drive coil.

On the other hand, there is also a demand for a reduction in the size of the mirror drive device. However, as described above, in a case where the drive coil is disposed in the back surface of the movable part and the single permanent magnet is disposed to overlap the support part and the movable part when viewed in the normal line direction, there is a tendency toward an increase in the size of the device for the following reasons. That is, in order to supply power to the drive coil and drive the mirror, the mirror drive device needs to be electrically connected to an electrode of the circuit board which is positioned on the outside of the mirror drive device and is connected to a power supply. Specifically, it is necessary that a lead-out conductor is laid out from an end portion of the drive coil to the support part, the lead-out conductor is connected to an electrode which is disposed on a surface of the support part on the same side as the back surface of the movable part, and the electrode and the electrode of the circuit board are electrically connected to each other. For such electrical connection, hitherto, a wire bonding method has been generally employed. Therefore, a region where the electrode is provided has to be secured in the support part, or a space where a wire is disposed has to be secured in the vicinity of the support part. In this case, the support part becomes unnecessarily large, and due to the space secured in the vicinity of the support part, the overall size of the mirror drive device is also increased.

This disclosure describes a mirror drive device and a method for producing the same capable of achieving a reduction in size while a magnetic field exerted on a drive coil is secured in a case where the drive coil is disposed at a surface of a movable part, the surface being opposite to a mirror.

Solution to Problem

A mirror drive device according to an aspect of this disclosure includes: a support part which has a frame-like shape; a movable part which is positioned at an inside of the support part, has a first and second principal surface facing each other, and is supported by the support part so as to be oscillated via a first connection member; a magnetic body which is positioned to face the support part and the second principal surface in a facing direction in which the first and second principal surfaces face each other and forms a magnetic field in the periphery of the movable part; and a circuit board which has a frame-like shape and is disposed between the support part and the magnetic body in the facing direction so as to cause the movable part to be disposed at an inside of the circuit board when viewed in the facing direction. The movable part includes a base member including the first and second principal surfaces, a mirror disposed at the first principal surface side, and at least one drive coil disposed at the second principal surface side so as to face the magnetic body. The support part includes a base portion which has a frame-like shape and is connected to the first connection member, a reinforcing portion which has a frame-like shape and extends from the base portion in a direction away from the magnetic body and the circuit board in the facing direction, and an electrode which is disposed at a position of the base portion, the position being on a surface side facing the magnetic body and overlapping the reinforcing portion when viewed in the facing direction. The drive coil is connected to the electrode by a lead-out conductor that extends from the movable part to the support part via the first connection member. The electrode is electrically connected to the circuit board.

In the mirror drive device according to the aspect of this disclosure, the drive coil is connected to the electrode disposed at the surface side of the base portion, the surface facing the magnetic body, by the lead-out conductor extending from the movable part to the support part via the first connection member. In the mirror drive device according to the aspect of this disclosure, the electrode is electrically connected to the circuit board disposed between the support part and the magnetic body in the facing direction of the first and second principal surfaces. As described above, since the circuit board is present between the support part and the magnetic body, electrical connection between the electrode disposed at the base portion surface side facing the magnetic body and the circuit board is achieved. Therefore, even in a case where the drive coil is disposed at the surface of the movable part, the surface being opposite to the mirror, it becomes possible to electrically connect the drive coil to the outside.

In the mirror drive device according to the aspect of this disclosure, the magnetic body faces the second principal surface in the facing direction. Therefore, the magnetic body and the movable part become adjacent to each other in the facing direction, and the magnetic body as a whole becomes close to the drive coil disposed at the second principal surface side of the movable part. Therefore, the magnetic field acting on the drive coil can be sufficiently secured.

In the mirror drive device according to the aspect of this disclosure, when viewed in the facing direction of the first and second principal surfaces, the circuit board is disposed between the support part and the magnetic body and the movable part is positioned at the inside of the circuit board. Therefore, the circuit board positioned between the support part and the magnetic body functions as a spacer for separating the movable part and the magnetic body from each other. Therefore, a space where the movable part is oscillated can be secured by the circuit board. Furthermore, since the circuit board has both its original function of supplying electricity to the drive coil and the function as the spacer, a reduction in the size of the mirror drive device can be achieved.

In the mirror drive device according to the aspect of this disclosure, the electrode is disposed at a position of the base portion, the position being on the surface side facing the magnetic body and overlapping the reinforcing portion when viewed in the facing direction. Therefore, when stress or the like is generated when the circuit board is electrically connected to the drive coil, the reinforcing portion primarily receives the stress or the like via the electrode and the base portion. Therefore, the movable part is less likely to be affected by the stress or the like.

In this specification, "the facing direction of the first and second principal surfaces" means a facing direction in a non-driven state of the mirror drive device (a non-conducting state in which the drive coil does not conduct current). In the non-driven state of the mirror drive device, the second principal surface of the movable part and the surface of the magnetic body facing the second principal surface substantially face squarely.

The circuit board may be disposed at a surface of the magnetic body, the surface facing the second principal surface.

In the facing direction, a sum of thicknesses of the base portion and the reinforcing portion may be greater than a thickness of the movable part. In this case, the strength of the support part is increased, and even though stress or the like is generated when the circuit board is electrically connected to the drive coil, the movable part is even less likely to be affected by the stress or the like.

The mirror drive device according to the aspect of this disclosure may further include a bump electrode which is disposed between the circuit board and the support part and connects the circuit board to the electrode. In this case, since the bump electrode is present between the magnetic body and the support part, the clearance between the second principal surface and the magnetic body is further increased. Therefore, a space where the movable part is oscillated can be further secured.

The base member may include a groove portion which is disposed at the second principal surface side and extends in a spiral shape when viewed in a direction perpendicular to the second principal surface, and the drive coil may be formed of a first metallic material disposed in the groove portion and is wound in a spiral shape when viewed in the direction perpendicular to the second principal surface.

The movable part may further include a coating layer which covers an opening of the groove portion and is formed of a second metallic material that suppresses diffusion of the first metallic material, and an insulating layer which is disposed on the second principal surface and the coating layer. In this case, the first metallic material forming the drive coil is less likely to diffuse toward an insulating layer, and the occurrence of a short circuit is prevented. Therefore, conduction failure caused by a short circuit is prevented. Accordingly, the drive coil wound at a high density is realized, and a higher Lorentz force can be exerted on the drive coil. As a result, the mirror drive device having a mirror with a large movable range can be obtained.

The first metallic material may be Cu or Au, and the second metallic material may be Al or an alloy containing Al. Cu or Au as the first metallic material is a material that has low electrical resistivity and is relatively easily diffusible, but the diffusion of such a material can be suppressed by the presence of the coating layer. Particularly, since the second metallic material forming the coating layer is Al or an alloy containing Al, the diffusion of the first metallic material is extremely suppressed. Therefore, while reducing the electrical resistivity of the drive coil, the occurrence of a short circuit can be prevented.

The movable part may further include an insulating layer which covers the opening of the groove portion.

A material forming the insulating layer may be SiN, and a thickness of the insulating layer may be 50 nm or greater. In this case, the diffusion of the metallic material forming the drive coil is suppressed.

The movable part may include a minor disposition portion including a portion where the mirror is disposed in the base member, and an outside portion including a frame-like portion that surrounds an outer periphery of the mirror disposition portion in the base member. The at least one drive coil may include the two drive coils. The outside portion may be supported by the support part so as to be oscillated via the first connection member. The mirror disposition portion may be supported by the outside portion so as to be oscillated via a second connection member which extends in a direction intersecting the first connection member. Each of the two drive coils may be wound in a spiral shape when viewed in the direction perpendicular to the second principal surface. A first drive coil of the two drive coils may be disposed at the second principal surface side in the mirror disposition portion. A second drive coil of the two drive coils may be disposed at the second principal surface side in the outside portion. In a surface of the magnetic body, the surface facing the second principal surface, a set of magnetic poles constituted by an S pole and an N pole arranged to be adjacent to each other in a direction along the surface may be exhibited. The second drive coil may have a portion that is positioned in a first region in which a magnetic flux density in a magnetic field formed in the periphery of the movable part by the set of magnetic poles shows the substantially maximum value. In this case, since the mirror disposition portion may be supported by the outside portion so as to be oscillated via the second connection member which extends in the direction intersecting the first connection member, the outside portion and the mirror disposition portion are oscillated about different axes of oscillation. Therefore, reflected light from the mirror can be two-dimensionally scanned. When the reflected light from the mirror is two-dimensionally scanned, rapidly oscillating the mirror disposition portion in order to scan the reflected light at a high speed in a first scanning direction, and oscillating the outside portion at a greater swing angle than that of the mirror disposition portion in order to intermittently scan the reflected light along a second scanning direction which intersects the first scanning direction may be considered. At this time, as described above, when the second drive coil has a portion that is positioned in the first region in which the magnetic flux density in the magnetic field formed in the periphery of the movable part by the set of the first and second magnetic poles shows the substantially maximum value, the Lorentz force exerted on the second drive coil can be increased while reducing the current flowing through the second drive coil disposed at the outside portion. Therefore, it becomes possible to achieve low power consumption while increasing the swing angle of the outside portion.

In this specification, "the substantially maximum value" refers to a range in which the maximum value is the upper limit and 80% of the maximum value is the lower limit. In addition, "the maximum value" refers to the highest value of the magnetic flux density of the magnetic field formed by the permanent magnet at the position in the movable part.

The magnetic body may have a first magnetic portion, a second magnetic portion and a third magnetic portion which are sequentially arranged to form a Halbach array along a predetermined direction, and the second drive coil may have a portion that is positioned in the first region. In this case, the magnetic flux density in the vicinity of the second drive coil is further increased by the first to third magnetic portions forming the Halbach array.

The magnetic body may include a first magnetic portion and a second magnetic portion which are adjacent to each other along a first direction perpendicular to the facing direction, a third magnetic portion and a fourth magnetic portion which are adjacent to each other along the first direction, and a fifth magnetic portion and a sixth magnetic portion which are arranged along a second direction perpendicular to both the facing direction and the first direction. The fifth and sixth magnetic portions may be positioned between the second and third magnetic portions and may be adjacent to the second and third magnetic portions in the first direction. A magnetization direction of each of the first, third and fifth magnetic portions may be directed from the first principal surface side toward the second principal surface side. A magnetization direction of each of the second, fourth and sixth magnetic portions may be directed from the second principal surface side toward the first principal surface side. The second drive coil may have a portion that is positioned in the first region. In this case, a high magnetic flux density can be formed in the vicinity of the second drive coil by the first to sixth magnetic portions arranged in a specific state as described above.

The first drive coil may have a portion that is positioned in a second region other than the first region. A current at a frequency corresponding to the resonant frequency of the mirror disposition portion may be caused to flow through the first drive coil and reflected tight may be scanned at a high speed along the first scanning direction. That is, the mirror disposition portion is oscillated due to resonance, and thus a high Lorentz force does not need to be exerted on the first drive coil in order to oscillate the mirror disposition portion. In this case, when the first drive coil has the portion positioned in the second region, the second drive coil is easily positioned in the first region. Therefore, the Lorentz force exerted on the second drive coil can be further increased.

A method for producing a mirror drive device according to another aspect of this disclosure includes: preparing a mirror structure which includes a support part which has a frame-like shape, and a movable part which is positioned at an inside of the support part, has a first and second principal surface facing each other, and is supported by the support part so as to be oscillated via a connection member, in which the movable part includes a base member including the first and second principal surfaces, a mirror disposed at the first principal surface side, and a drive coil disposed at the second principal surface side, the support part includes a base portion which has a frame-like shape and is connected to the connection member, a reinforcing portion which has a frame-like shape and extends from the base portion in a direction from the second principal surface toward the first principal surface in a facing direction in which the first and second principal surfaces face each other, and an electrode which is disposed at a position of the base portion, the position being on a surface side opposite to the reinforcing portion and overlapping the reinforcing portion when viewed in the facing direction, and the drive coil is connected to the electrode by a lead-out conductor that extends from the movable part to the support part via the connection member; assembling the mirror structure, a magnetic body, and a circuit board such that the magnetic body which forms a magnetic field in the periphery of the movable part faces the support part and the second principal surface in the facing direction, the circuit board which has a frame-like shape is positioned on an outside of the movable part when viewed in the facing direction, and the circuit board is positioned between the support part and the magnetic body in the facing direction, thereby electrically connecting the circuit board to the drive coil via the electrode.

In the method for producing a mirror drive device according to the aspect of this disclosure, the drive coil is connected to the electrode disposed at the surface side of the base portion, the surface positioned on the side opposite to the reinforcing portion, by the lead-out conductor that extends from the movable part to the support part via the connection member. The drive coil and the circuit board positioned between the support part and the magnetic body in the facing direction in which the first and second principal surfaces face each other are electrically connected to each other via the electrode. As described above, since the circuit board is present between the support part and the magnetic body, electrical connection between the electrode disposed on the surface side of the base portion, the surface positioned on the side opposite to the reinforcing portion, and the circuit board is achieved. Therefore, even in a case where the drive coil is disposed at the surface of the movable part, the surface being opposite to the mirror, it becomes possible to electrically connect the drive coil to the outside.

In the method for producing a mirror drive device according to the aspect of this disclosure, the magnetic body faces the second principal surface in the facing direction. Therefore, the magnetic body and the movable part become adjacent to each other in the facing direction, and the magnetic body as a whole becomes close to the drive coil disposed at the second principal surface side of the movable part. Therefore, the magnetic field acting on the drive coil can be sufficiently secured.

In the method for producing a mirror drive device according to the aspect of this disclosure, the circuit board is positioned on the outside of the movable part when viewed in the facing direction and the circuit board is disposed between the support part and the magnetic body in the facing direction. Therefore, the circuit board positioned between the support part and the magnetic body functions as a spacer for separating the movable part and the magnetic body from each other. Therefore, a space where the movable part is oscillated can be secured by the circuit board. Furthermore, since the circuit board has both its original function of supplying electricity to the drive coil and the function as the spacer, a reduction in the size of the mirror drive device can be achieved.

In the method for producing a mirror drive device according to the aspect of this disclosure, the electrode is disposed at a position of the base portion, the position being on the side opposite to the reinforcing portion and overlapping the reinforcing portion when viewed in the facing direction. Therefore, when stress or the like is generated when the circuit board is electrically connected to the drive coil, the reinforcing portion primarily receives the stress or the like via the electrode and the base portion. Therefore, the movable part is less likely to be affected by the stress or the like.

The method for producing a mirror drive device according to the aspect of this disclosure may further include disposing the circuit board on a portion of a surface of the magnetic body after the preparation of the mirror structure and before the electrical connection of the circuit board to the drive coil. In this case, since the circuit board is present between the magnetic body and the support part, the direct distance between the second principal surface and the magnetic body can be further increased. Therefore, a space where the movable part is oscillated can be sufficiently secured. In this case, during the production of the mirror drive device, the mirror structure may be placed on the circuit board so that the support part overlaps the circuit board. Therefore, during the production of the mirror drive device, substantially no load is exerted on the mirror having low strength. Therefore, the mirror is less likely to be broken during the production process of the mirror drive device, resulting in an increase in yield.

The method for producing a mirror drive device according to the aspect of this disclosure may further include disposing a bump electrode on the electrode after the preparation of the mirror structure and before the electrical connection of the circuit board to the drive coil. When the circuit board and the drive coil are electrically connected to each other, the bump electrode may be connected to the circuit board so as to assemble the mirror structure and the bump electrode with the magnetic body and the circuit board. In this case, since the bump electrode is present between the magnetic body and the support part, the clearance between the second principal surface and the magnetic body is further increased. Therefore, a space where the movable part is oscillated can be further secured.

Effects of Invention

In the mirror drive device and the method for producing the same according to this disclosure, in a case where the drive coil is disposed at the surface of the movable part, the surface being opposite to the mirror, a reduction in size can be achieved while a magnetic field exerted on the drive coil is secured.

BRIEF DESCRIPTION OF DRAWINGS

FIG. 9 is a view for explaining a part of a production process of the mirror drive device according to the embodiment.

FIG. 13 is a plan view illustrating an upper surface side of a circuit board according to another example.

Figure 18:
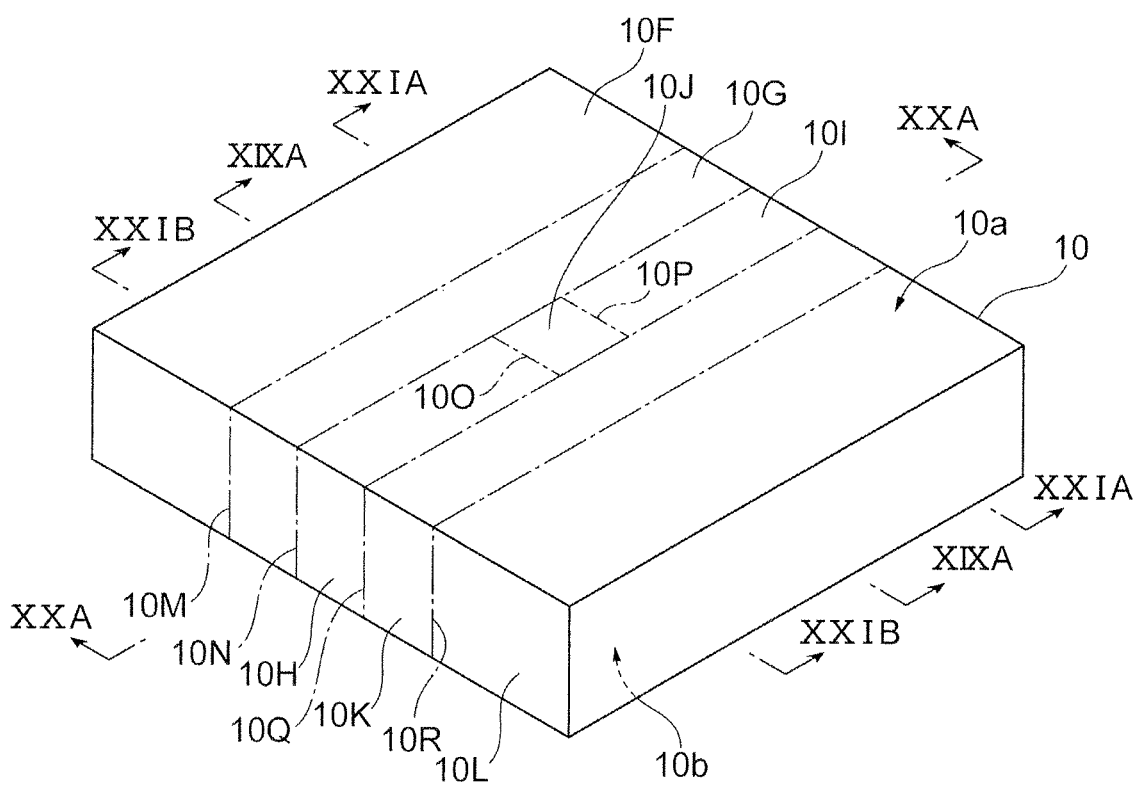
FIG. 18 is a perspective view illustrating a permanent magnet according to another example.

(a) of FIG. 19 shows a sectional view taken along line XIXA-XIXA of FIG. 18, and (b) of FIG. 19 is a graph showing the pattern of a magnetic flux density of a magnetic field formed in the periphery of a movable part by the permanent magnet in the sectional view taken along line XIXA-XIXA of FIG. 18.

(a) of FIG. 20 shows a sectional view taken along line XXA-XXA of FIG. 18, and (b) of FIG. 20 is a graph showing the pattern of a magnetic flux density of a magnetic field formed in the periphery of the movable part by the permanent magnet in the sectional view taken along line XXA-XXA of FIG. 18.

(a) of FIG. 21 shows a sectional view taken along line XXIA-XXIA of FIG. 18, and (b) of FIG. 21 shows a sectional view taken along line XXIB-XXIB of FIG. 18.

Figure 22:
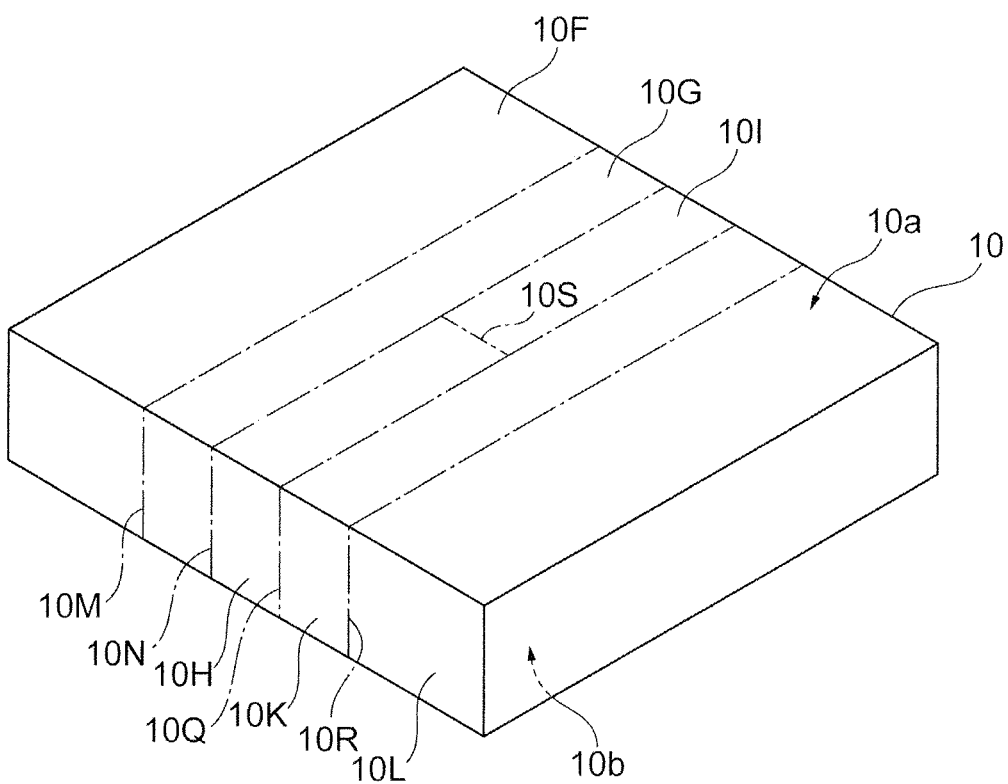

FIG. 22 is a perspective view illustrating a permanent magnet according to another example.

DESCRIPTION OF EMBODIMENTS

An embodiment of the present invention has been described with reference to the drawings, and the embodiment described below is only an example for explaining the present invention and is not intended to be limiting of the present invention to the following description. In the description, same elements or elements having similar functions are denoted by same reference numerals, and overlapping descriptions will be omitted.

Figure 1:
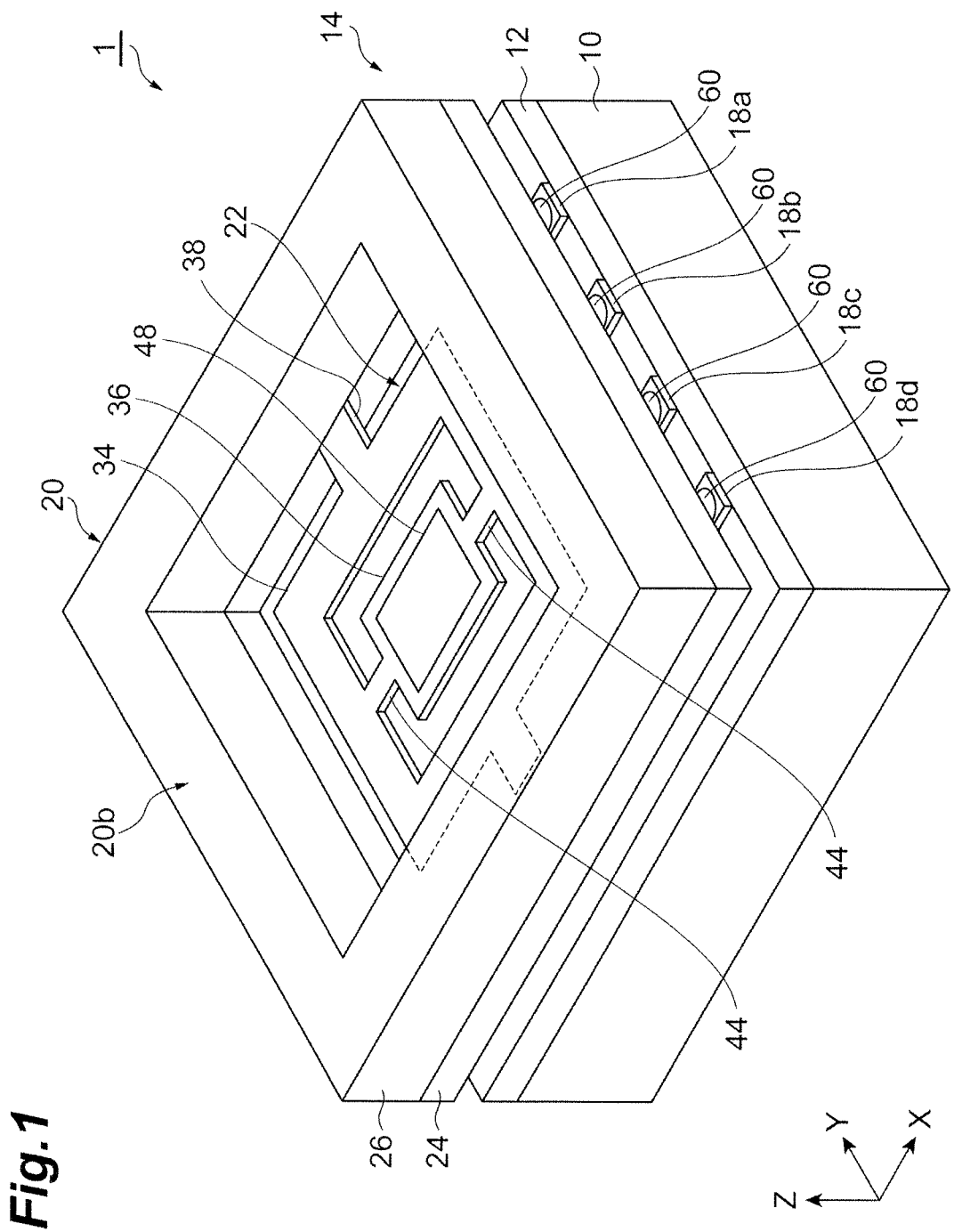
FIG. 1 is a perspective view illustrating a mirror drive device according to an embodiment.
Figure 2:
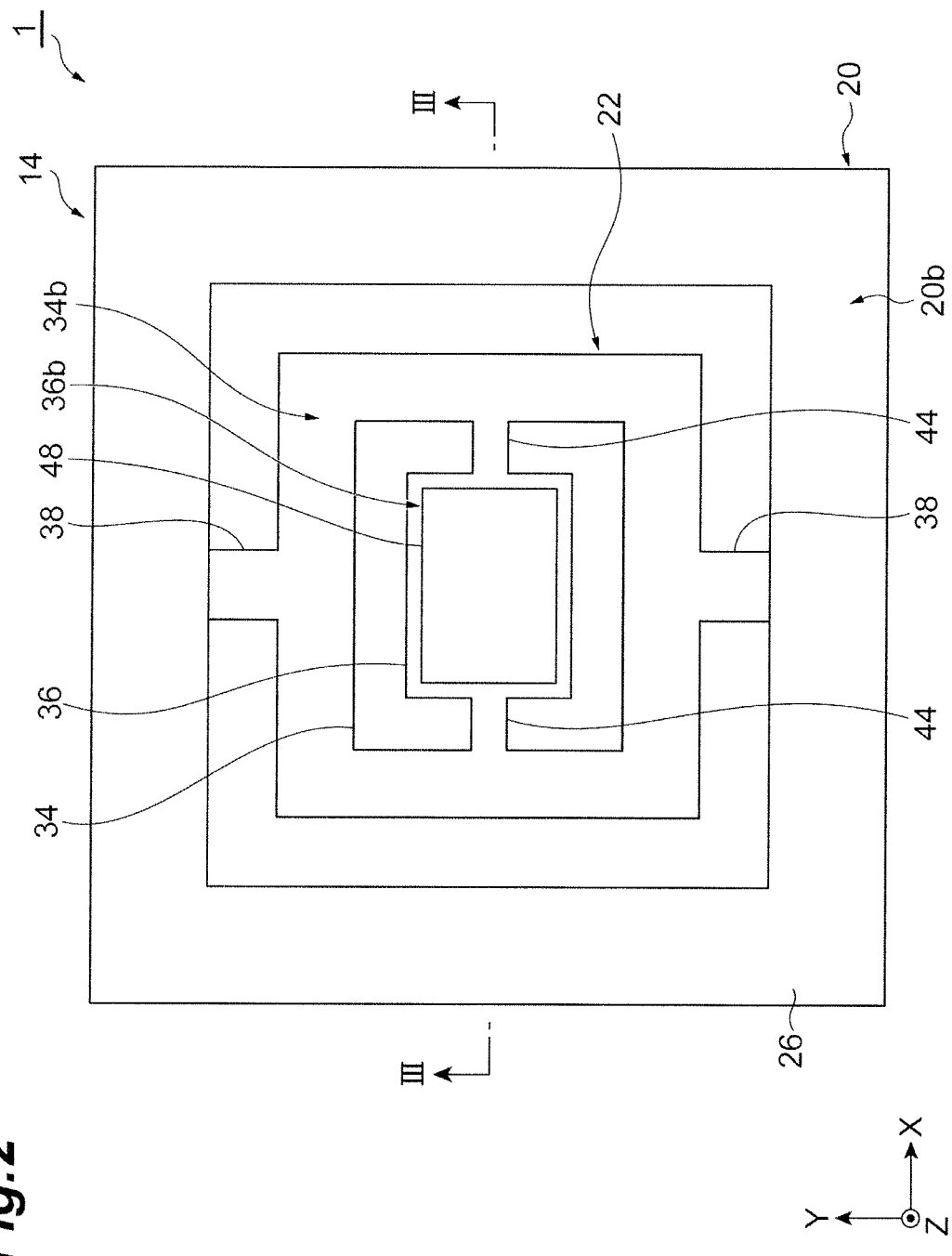
FIG. 2 is a plan view illustrating the mirror drive device according to the embodiment.
Figure 3:
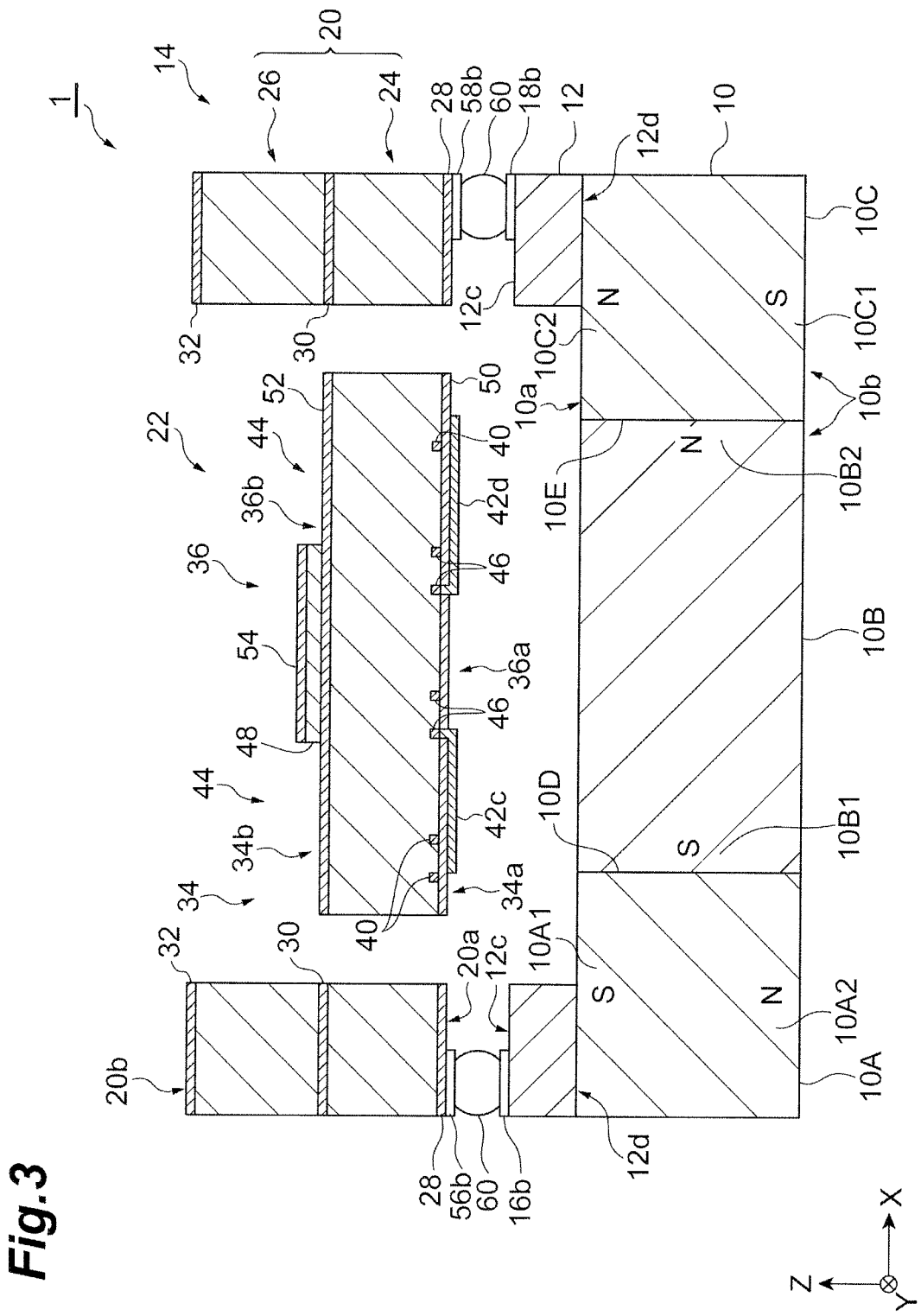
FIG. 3 is a sectional view taken along line II-II of FIG. 2.

As illustrated in FIGS. 1 to 3, a mirror drive device 1 includes a permanent magnet 10, a circuit board 12 and a mirror structure 14. The permanent magnet 10, the circuit board 12 and the mirror structure 14 are arranged in this order in a Z-axis direction shown in FIG. 1 and the like (upward and downward directions in FIG. 1 and the like, and hereinafter simply referred to as "Z-axis direction").

Figure 4:
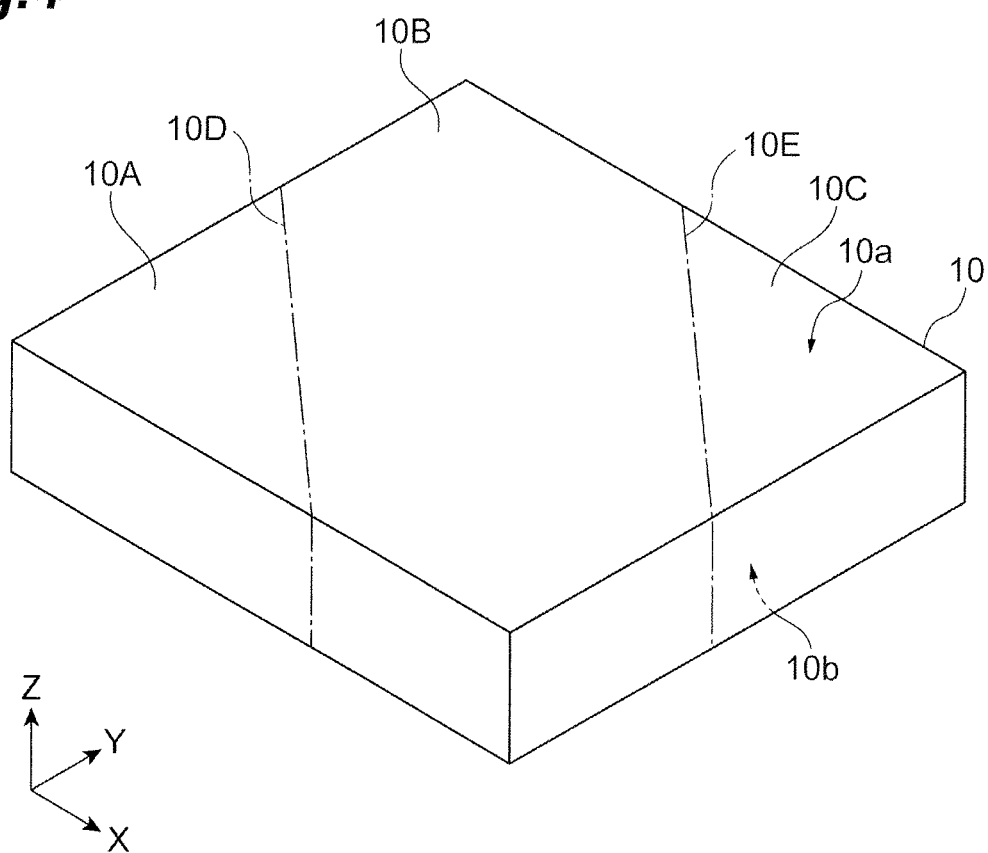
FIG. 4 is a perspective view illustrating a permanent magnet.

As illustrated in FIGS. 3 and 4, the permanent magnet 10 is a flat plate having a rectangular shape. The permanent magnet 10 forms a magnetic field in the periphery of a movable part 22 (drive coils 40 and 46 described below) described below. The thickness of the permanent magnet 10 may be set to, for example, about 2 mm to 3 mm.

The permanent magnet 10 includes a pair of principal surfaces 10a and 10b having a rectangular shape. That is, when viewed in the Z-axis direction, the principal surfaces 10a and 10b each have a pair of sides extending along an X-axis direction perpendicular to the Z-axis direction, and a pair of sides extending along a Y-axis direction perpendicular to both the X-axis direction and the Z-axis direction. The principal surfaces 10a and 10b have a flat surface shape. The normal line directions of the principal surfaces 10a and 10b of the permanent magnet 10 are coincident with the Z-axis direction of this embodiment.

The permanent magnet 10 includes magnetic portions 10A to 10C. As illustrated in FIG. 4, the magnetic portions 10A and 10C are respectively positioned on one end side and the other end side with respect to a diagonal direction of the bottom surface of the permanent magnet 10. The magnetic portion 10B is positioned between the magnetic portions 10A and 10C. That is, the magnetic portions 10A to 10C are arranged in this order in a predetermined direction.

A boundary surface 10D is formed by a surface where the magnetic portions 10A and 10B are in contact with each other. A boundary surface 10E is formed by a surface where the magnetic portions 10B and 10C are in contact with each other. The boundary surfaces 10D and 10E are substantially parallel to the Z-axis direction and are substantially parallel to each other. The boundary surfaces 10D and 10E intersect both the X-axis direction and the Y-axis direction. The boundary surfaces 10D and 10E may be perpendicular to a bisector that bisects an angle formed between the X-axis and the Y-axis.

Returning to FIG. 3, the magnetic portion 10A has magnetic poles 10A1 and 10A2 having different polarities. The magnetic pole 10A1 is positioned on the principal surface 10a side. The magnetic pole 10A2 is positioned on the principal surface 10b side. The magnetic portion 10B has magnetic poles 10B1 and 10B2 having different polarities. The magnetic pole 10B1 is positioned on the boundary surface 10D side. The magnetic pole 10B2 is positioned on the boundary surface 10E side. The magnetic portion 10C has magnetic poles 10C1 and 10C2 having different polarities. The magnetic pole 10C1 is positioned on the principal surface 10b side. The magnetic pole 10C2 is positioned on the principal surface 10a side.

In this embodiment, the magnetic poles 10A1, 10B1 and 10C1 are S poles. On the other hand, the magnetic poles 10A2, 10B2 and 10C2 are N poles. Therefore, a demagnetizing field directed toward the principal surface 10a from the principal surface 10b is generated inside the magnetic portion 10A. A demagnetizing field directed toward the boundary surface 10D from the boundary surface 10E is generated inside the magnetic portion 10B. A demagnetizing field directed toward the principal surface 10b from the principal surface 10a is generated inside the magnetic portion 10C. Therefore, a set of the magnetic poles 10B1 (S pole) and 10B2 (N pole) which are adjacent to each other in a direction along the principal surface 10a appears in the principal surface 10a.

The directions of the demagnetizing fields between the magnetic portions 10A and 10B which are adjacent to each other are perpendicular to each other. The directions of the demagnetizing fields between the magnetic portions 10B and 10C which are adjacent to each other are perpendicular to each other. The directions of the demagnetizing fields between the magnetic portions 10A and 10C which are positioned with the magnetic portion 10B interposed therebetween are opposite to each other. As described above, the magnetic portions 10A to 10C form a Halbach array. Therefore, an intense magnetic field is formed on the principal surface 10a side of the permanent magnet 10 in the vicinity of the movable part 22 described below. Specifically, an intense magnetic field is formed on the principal surface 10a side of the permanent magnet 10 in the vicinity of the boundary of the set of the magnetic poles 10B1 and 10B2. The magnetic flux density of the magnetic field formed in the periphery of the movable part 22 by the set of the magnetic poles 10B1 and 10B2 shows the substantially maximum value in the vicinity of the boundary of the set of the magnetic poles 10B1 and 10B2, and tends to decrease as the distance from the boundary increases.

Figure 5:
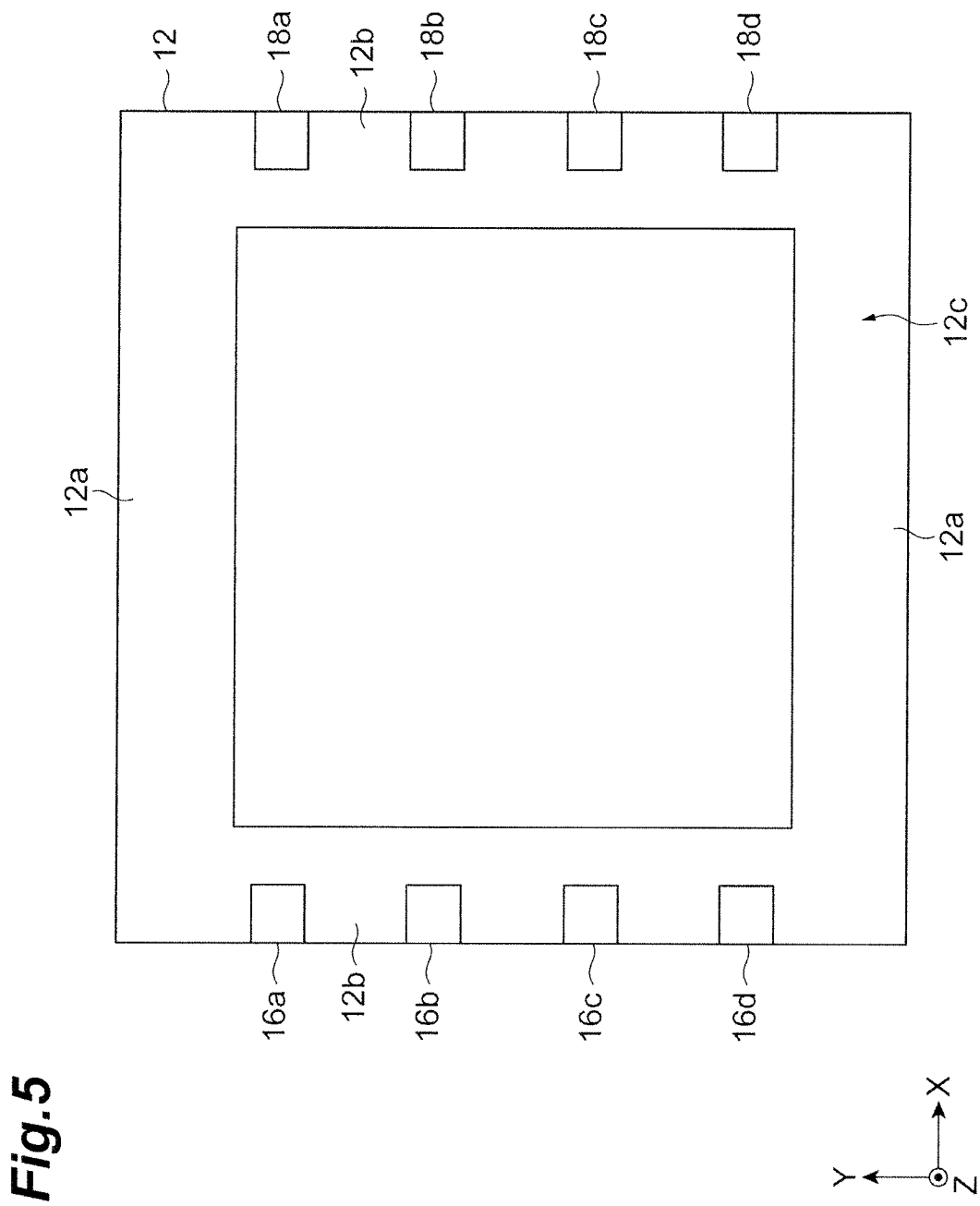
FIG. 5 is a plan view illustrating an upper surface side of a circuit board.

For example, the circuit board 12 is a flexible printed board. As illustrated in FIGS. 1, 3 and 5, the circuit board 12 is a frame-like member having a rectangular external shape when viewed in the Z-axis direction and has an annular shape such that the center portion thereof is open. For example, the circuit board 12 is attached onto the principal surface 10a of the permanent magnet 10 by an adhesive. The circuit board 12 extends along each of the sides of the permanent magnet 10 on the principal surface 10a of the permanent magnet 10. That is, the circuit board 12 corresponds to each of the sides of the permanent magnet 10 and includes a pair of first portions 12a extending along the X-axis direction and a pair of second portions 12b extending along the Y-axis direction (see FIG. 5).

On a surface 12c of one of the pair of second portions 12b, electrodes 16a to 16d are disposed. On the surface 12c of the other of the pair of second portions 12b, electrodes 18a to 18d are disposed. The surface 12c of the second portions 12b where the electrodes 16a to 16d and 18a to 18d are disposed is a surface opposite to a surface 12d (see FIG. 3) of the second portions 12b, the surface 12d facing the principal surface 10a of the permanent magnet 10, that is, a surface that faces the mirror structure 14.

Returning to FIG. 5, the electrodes 16a to 16d are electrically connected to the drive coils 40 and 46 described below. On the other hand, the electrodes 18a to 18d are dummy electrodes for height adjustment and are not electrically connected to the drive coils 40 and 46 described below.

As illustrated in FIG. 3, the mirror structure 14 includes a support part 20 and the movable part 22. The support part 20 is a frame-like member having a rectangular shape, and the center portion thereof is open. The thickness of the support part 20 may be set to, for example, about 250 µm to 300 µm.

The support part 20 overlaps the principal surface 10a of the permanent magnet 10 and the circuit board 12 when viewed in the Z-axis direction (the normal line direction of the principal surface 10a of the permanent magnet 10). The support part 20 has a surface 20a on a side facing the permanent magnet 10 and the circuit board 12, and a surface 20b on a side further away from the permanent magnet 10 and the circuit board 12 than the surface 20a. The support part 20 includes a base portion 24 and a reinforcing portion 26.

Both the base portion 24 and the reinforcing portion 26 are frame-like members having a rectangular shape, and the center portions thereof are open. The base portion 24 is positioned at the surface 20a side of the support part 20. The thickness of the base portion 24 is substantially the same as that of the movable part 22. The reinforcing portion 26 is positioned at the surface 20b side of the support part 20. That is, the reinforcing portion 26 extends from the base portion 24 toward the side away from the permanent magnet 10 and the circuit board 12. Therefore, in the Z-axis direction, the thickness of the support part 20 (the sum of the thicknesses of the base portion 24 and the reinforcing portion 26) is greater than that of the movable part 22. Both the base portion 24 and the reinforcing portion 26 may be formed of, for example, Si (silicon).

Figure 6:
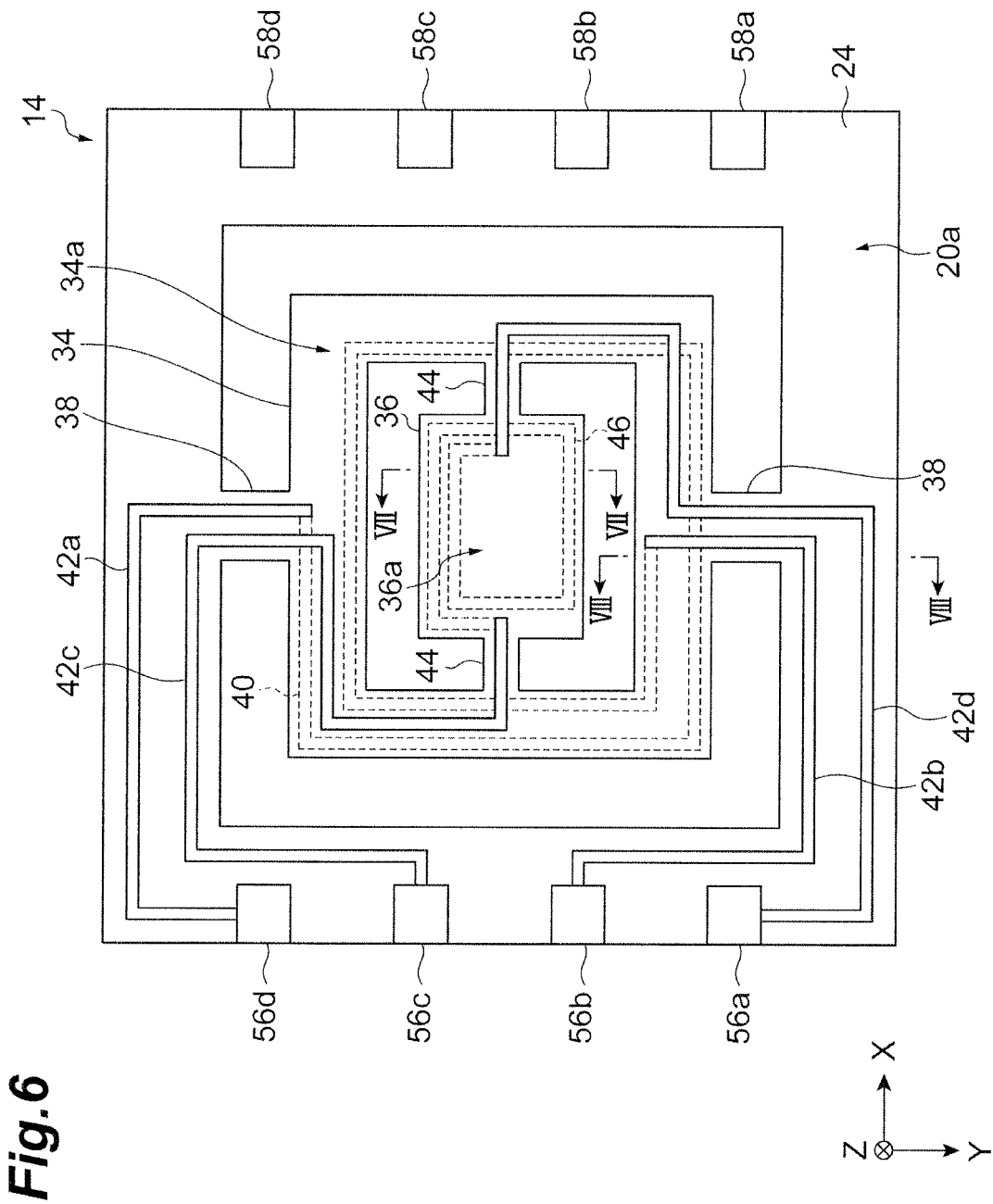
FIG. 6 is a plan view illustrating a lower surface side of a minor structure.

An insulating layer 28 is disposed at the surface 20a side of the base portion 24. That is, the surface of the insulating layer 28 forms the surface 20a of the support part 20. As illustrated in FIG. 6, on the insulating layer 28, electrodes 56a to 56d are disposed at positions corresponding to the electrodes 16a to 16d of the circuit board 12, and electrodes 58a to 58d are disposed at positions corresponding to the electrodes 18a to 18d of the circuit board 12. The electrodes 58a to 58d are dummy electrodes for height adjustment and are not electrically connected to the drive coils 40 and 46 described below. The electrodes 56a to 56d and 58a to 58d are positioned at an end portion of the base portion 24 (the support part 20) close to the permanent magnet 10.

As illustrated in FIG. 3, the electrodes 56a to 56d are electrically and physically connected to the corresponding electrodes 16a to 16d by bump electrodes 60, respectively. The electrodes 58a to 58d are electrically and physically connected to the corresponding electrodes 18a to 18d by the bump electrodes 60, respectively. Therefore, the bump electrode 60 is disposed between the circuit board 12 and the support part 20.

An insulating layer 30 is disposed between the base portion 24 and the reinforcing portion 26. An insulating layer 32 is disposed at the surface 20b side of the reinforcing portion 26. That is, the surface of the insulating layer 32 forms the surface 20b of the support part 20. The insulating layers 28, 30 and 32 may be formed of, for example, silicon dioxide ($SiO_2$).

As illustrated in FIGS. 1 to 3, the movable part 22 is positioned at the inside of the support part 20 (in the opening). The movable part 22 has one principal surface facing the permanent magnet 10 side and the other principal surface facing the side opposite to the permanent magnet 10. The facing directions of these principal surfaces forming a pair are coincident the Z-axis direction in a non-driven state of the minor drive device 1 (a non-conducting state in which the drive coils 40 and 46 described below, do not conduct current). The movable part 22 is separated from the permanent magnet 10 and the support part 20. The movable part 22 does not overlap the circuit board 12 when viewed in the Z-axis direction. Therefore, the movable part 22 is disposed at the inside of the circuit board 12 (in the opening) when viewed in the Z-axis direction. That is, the circuit board 12 is disposed at the outside of the movable part 22. The movable part 22 includes an outside portion 34 positioned at the outside and a mirror disposition portion 36 positioned at the inside of the outside portion 34.

The outside portion 34 is a frame-like member in a flat plate shape having a rectangular shape. The outside portion 34 surrounds the outer periphery of the minor disposition portion 36. The outside portion 34 has a principal surface 34a facing the permanent magnet 10 side and a principal surface 34b facing the side opposite to the permanent magnet 10. The principal surface 34a is included in one principal surface of the movable part 22, and the principal surface 34b is included in the other principal surface of the movable part 22.

As illustrated in FIGS. 1, 2 and 6, the outside portion 34 is attached to the base portion 24 of the support part 20 so as to be oscillated, via a pair of connection members 38 which are arranged on the same straight line. That is, the outside portion 34 is supported to perform reciprocating rotary motion with respect to the base portion 24 (the support part 20) via the pair of connection members 38. The angle of oscillation of the outside portion 34 is, for example, about ±5° to ±10°. The connection member 38 has a straight line shape in this embodiment.

As illustrated in FIG. 6, the drive coil 40 is disposed at the principal surface 34a side of the outside portion 34. Therefore, the drive coil 40 faces the principal surface 10a of the permanent magnet 10. The drive coil 40 is spirally wound into a plurality of turns at the principal surface 34a side of the outside portion 34 when viewed in the normal line direction of the principal surface 34a. The drive coil 40 has a portion that is positioned in a region in which the magnetic flux density in the magnetic field formed in the periphery of the movable part 22 by the magnetic portions 10A and 10B (the set of the magnetic poles 10B1 and 10B2) forming the Halbach array shows the substantially maximum value. The entirety of the drive coil 40 may be disposed in the corresponding region.

One end of the drive coil 40 is positioned at the outside of the drive coil 40 having the spiral shape. One end of a lead-out conductor 42a is electrically connected to the outer end portion of the drive coil 40. The other end of the lead-out conductor 42a extends on the connection member 38 and the surface 20a of the support part 20 and is connected to the electrode 56d.

The other end of the drive coil 40 is positioned at the inside of the drive coil 40 having the spiral shape. One end of a lead-out conductor 42b is electrically connected to the inner end portion of the drive coil 40. The other end of the lead-out conductor 42b extends on the connection member 38 and the surface 20a of the support part 20 and is connected to the electrode 56b.

The mirror disposition portion 36 is a flat plate having a rectangular shape. The mirror disposition portion 36 has a principal surface 36a facing the permanent magnet 10 side and a principal surface 36b facing the side opposite to the permanent magnet 10. The principal surface 36a is included in one principal surface of the movable part 22, and the principal surface 36b is included in the other principal surface of the movable part 22.

As illustrated in FIGS. 1, 2 and 6, the mirror disposition portion 36 is attached to the outside portion 34 so as to be oscillated via a pair of connection members 44 which are arranged on the same straight line. That is, the mirror disposition portion 36 is supported to perform reciprocating rotary motion with respect to the outside portion 34 via the pair of connection members 44. The angle of oscillation of the mirror disposition portion 36 is, for example, about ±5° to ±10°. The connection member 44 has a straight line shape in this embodiment. An arrangement direction of the pair of connection members 44 is substantially perpendicular to an arrangement direction of the pair of connection members 38 when viewed in the Z-axis direction.

As illustrated in FIG. 6, the drive coil 46 is disposed on the principal surface 36a side of the mirror disposition portion 36. Therefore, the drive coil 46 faces the principal surface 10a of the permanent magnet 10. The drive coil 46 is spirally wound into a plurality of turns at the principal surface 36a side of the mirror disposition portion 36 when viewed in the normal line direction of the principal surface 36a.

One end of the drive coil 46 is positioned at the outside of the drive coil 46 having the spiral shape. One end of a lead-out conductor 42c is electrically connected to the outer end portion of the drive coil 46. The other end of the lead-out conductor 42c extends on the connection member 44, the principal surface 34a of the outside portion 34, the connection member 38, and the surface 20a of the support part 20 and is connected to the electrode 56c.

The other end of the drive coil 46 is positioned at the inside of the drive coil 46 having the spiral shape. One end of a lead-out conductor 42d is electrically connected to the inner end portion of the drive coil 46. The other end of the lead-out conductor 42d extends on the connection member 44, the principal surface 34a of the outside portion 34, the connection member 38, and the surface 20a of the support part 20 and is connected to the electrode 56a.

As illustrated in FIGS. 1 to 3, a mirror 48 is disposed at the principal surface 36b side of the mirror disposition portion 36. The mirror 48 is a light reflective film formed of a thin metal film. Examples of a metallic material forming the mirror 48 include aluminum (Al), gold (Au), and silver (Ag).

As illustrated in FIG. 3, an insulating layer 50 is disposed on a surface of the outside portion 34, the mirror disposition, portion 36, and the connection members 38 and 44, the surface facing the permanent magnet 10. That is, the surface of the insulating layer 50 forms the principal surface 34a of the outside portion 34 and the principal surface 36a of the mirror disposition portion 36. An insulating layer 52 is disposed on a surface of the outside portion 34, the mirror disposition portion 36, and the connection members 38 and 44, the surface facing an opposite side to the permanent magnet 10. That is, the surface of the insulating layer 52 forms the principal surface 34b of the outside portion 34 and the principal surface 36b of the mirror disposition portion 36. An insulating layer 54 is disposed on a surface of the mirror 48, the surface facing an opposite side to the principal surface 36b of the mirror disposition portion 36. The insulating layers 50, 52 and 54 may be formed of, for example, silicon dioxide ($SiO_2$).

Subsequently, the structure of the vicinity of the drive coil 46 will be described below. The structure of the vicinity of the drive coil 40 is the same as that of the vicinity of the drive coil 46 and thus the description thereof will be omitted.

Figure 7:
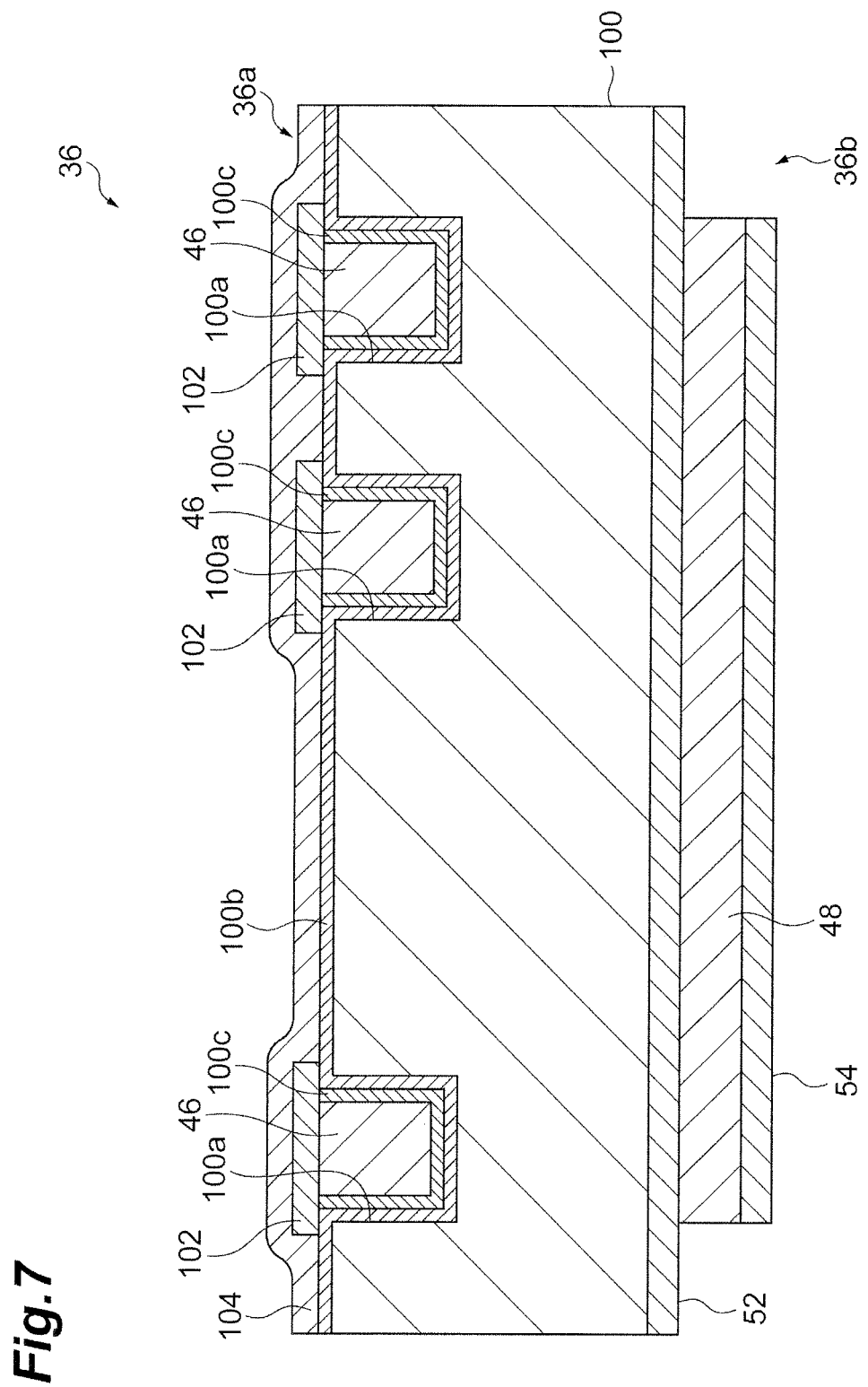
FIG. 7 is a sectional view taken along line VII-VII of FIG. 6.

As illustrated in FIG. 7, the mirror disposition portion 36 includes a base member 100, the drive coil 46, a coating layer 102 and an insulating layer 104. The base member 100 has a groove portion 100a having a shape corresponding to the drive coil 46 in the surface on the principal surface 36a side of the mirror disposition portion 36. That is, the groove portion 100a extends in a spiral shape when viewed in the normal line direction of the principal surface 36a of the mirror disposition portion 36. The thickness of the base member 100 may be set to, for example, about 20 μm to 60 μm.

An insulating layer 100b is disposed on the surface of the base member 100, the surface being on the principal surface 36a side of the mirror disposition portion 36, and on the inner wall surface of the groove portion 100a. The insulating layer 100b is a thermally oxidized film which is obtained by thermally oxidizing the base member 100. The insulating layer 100b may be formed of, for example, $SiO_2$ (silicon oxide). A seed layer 100c is disposed on the insulating layer 100b as the inner wall surface of the groove portion 100a. That is, the seed layer 100c is positioned between the insulating layer 100b and the drive coil 46. For example, a metallic material forming the seed layer 100c may be TiN.

A metallic material forming the drive coil 46 is disposed in the groove portion 100a on the seed layer 100c. Examples of the metallic material include Cu and Au. The thickness of the drive coil 46 may be set to, for example, about 5 μm to 10 μm.

The coating layer 102 extends onto the surface on the principal surface 36a side of the mirror disposition portion 36 so as to cover the opening of the groove portion 100a. That is, the coating layer 102 covers the entirety of the surface of the drive coil 46 on the principal surface 36a side of the mirror disposition portion 36 and covers the periphery of the groove portion 100a on the base member 100 when viewed in the normal line direction of the principal surface 36a of the mirror disposition portion 36.

A metallic material forming the coating layer 102 has a function of suppressing diffusion of the metallic material forming the drive coil 46. Examples of the metallic material forming the coating layer 102 include Al and an alloy containing Al. Examples of the alloy containing Al include an Al—Si alloy, an Al—Cu alloy, and an Al—Si—Cu alloy. In the composition ratio of the Al—Si alloy, for example, Al may occupy 99% and Si may occupy 1%. In the composition ratio of the Al—Cu alloy, for example, Al may occupy 99% and Cu may occupy 1%. In the composition ratio of the Al—Si—Cu alloy, for example, Al may occupy 98%, Si may occupy 1%, and Cu may occupy 1%. The thickness of the coating layer 102 may be set to, for example, about 1 μm.

The insulating layer 104 is disposed to cover the upper surfaces of the base member 100 and the coating layer 102. Examples of a material forming the insulating layer 104 include $SiO_2$, SiN and TEOS. The insulating layer 104 is the same element as the insulating layer 50 illustrated in FIG. 3.

Subsequently, the state of connection between the inner end portion of the drive coil 40 and one end of the lead-out conductor 42b will be described with reference to FIG. 8. The state of connection between the outer end portion of the drive coil 40 and one end of the lead-out conductor 42a, the state of connection between the outer end portion of the drive coil 46 and one end of the lead-out conductor 42c, and the state of connection between the inner end portion of the drive coil 46 and one end of the lead-out conductor 42d are the same as that of the state of connection between the inner end portion of the drive coil 40 and one end of the lead-out conductor 42b, and thus the description thereof will be omitted.

Figure 8:
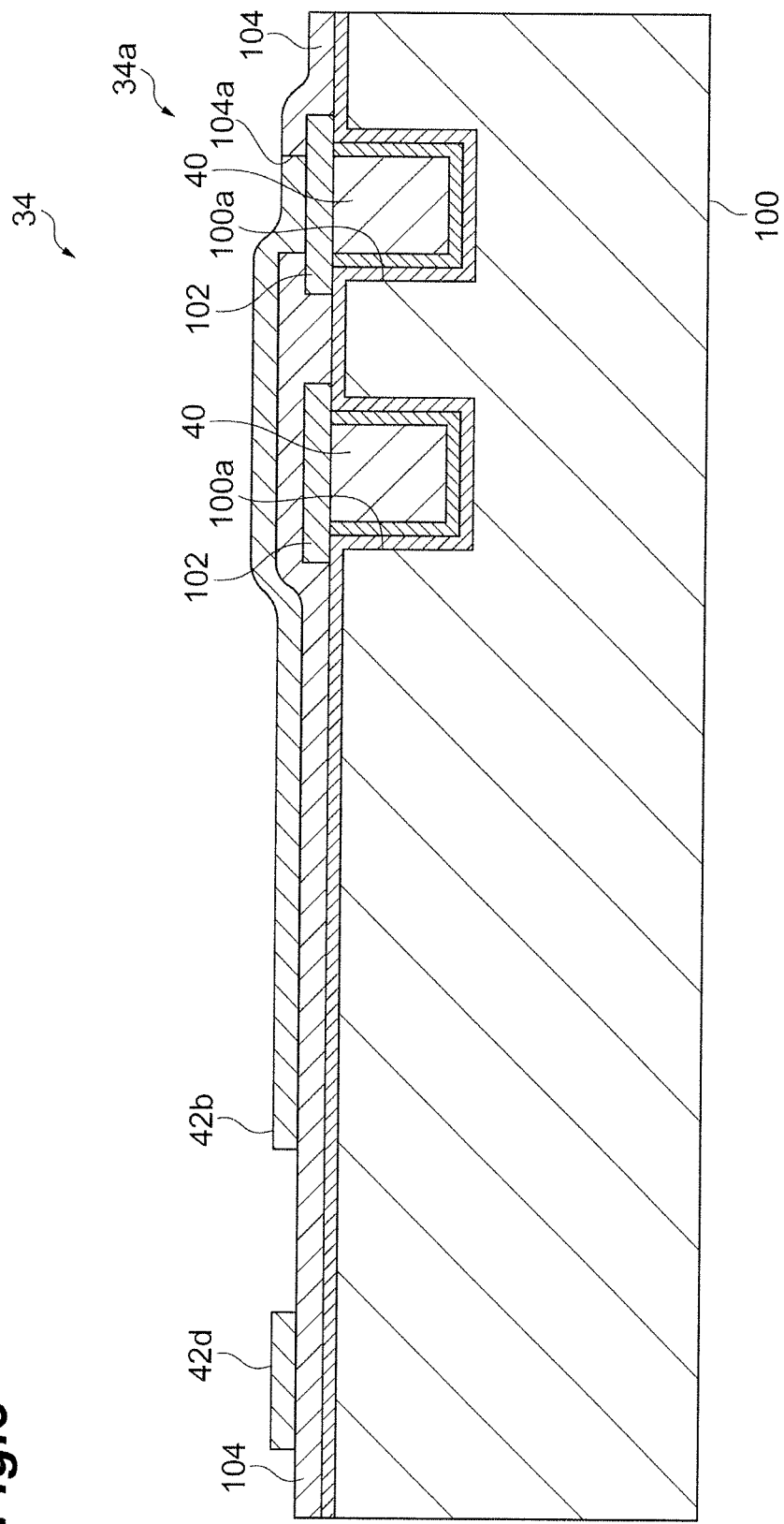
FIG. 8 is a sectional view taken along line VIII-VIII of FIG. 6.

As illustrated in FIG. 8, the upper portion of the inner end portion of the drive coil 40 connected to one end of the lead-out conductor 42b is not covered by the insulating layer 104. That is, the coating layer 102 at the inner end portion of the drive coil 40 is exposed to the outside through an opening portion 104a formed in the insulating layer 104. One end of the lead-out conductor 42b is buried in the opening portion 104a and is physically and electrically connected to the coating layer 102. The other portion of the lead-out conductor 42b is disposed on the insulating layer 104.

Next, a method for producing the mirror drive device 1 described above will be described with reference to FIGS. 9 and 10.

First, as illustrated in (a) of FIG. 9, for example, a bonded silicon substrate (so-called SOI substrate) of about 300 μm is prepared. The bonded silicon substrate includes a substrate 200, an intermediate layer 202 and a substrate 204 bonded together in this order. The thickness of the substrate 200 is, for example, about 50 μm. The intermediate layer 202 is a silicon oxide layer. The thickness of the intermediate layer 202 is, for example, about 1 μm. The thickness of the substrate 204 is, for example, about 250 μm.

A silicon oxide film 206 is formed on the surface of the substrate 204 through thermal oxidation. The thickness of the silicon oxide film 206 is, for example, about 0.5 μm. Next, the groove portion 100a is formed in the surface of the substrate 200. For example, the groove portion 100a is formed by forming a mask with a predetermined pattern on the surface of the substrate 200 and subsequently etching the substrate 200 via the mask.

Next, the insulating layer 100b is formed by thermally oxidizing the surface of the substrate 200. Next, the seed layer 100c is formed on the insulating layer 100b as the inner wall surface of the groove portion 100a. The seed layer 100c may be obtained by sputtering the base member 100 (the insulating layer 100b) with a dense metallic material having adhesion to the metallic material forming the drive coil 46.

Next, the drive coil 46 is formed in the groove portion 100a. Specifically, the drive coil 46 may be obtained by burying a metallic material on the seed layer 100c by a damascene method. Examples of a method of burying the metallic material in the groove portion 100a include plating, sputtering and CVD. After the metallic material is disposed in the groove portion 100a, the surface of the substrate 200 (the surface on the principal surface 36a side of the mirror disposition portion 36) may be planarized by chemical mechanical polishing.

Next, the coating layer 102 is formed to cover the opening of the groove portion 100a. For example, the coating layer 102 may be obtained by causing a metallic material to be deposited on the entire surface of the substrate 200 by a sputtering method or a CVD method and subsequently patterning the metallic material.

Subsequently, as illustrated in (b) of FIG. 9, the insulating layer 104 is formed. For example, the insulating layer 104 may be obtained by causing an insulating material to be deposited on the entire surface of the substrate 200 and thereafter removing portions corresponding to both end portions of the drive coils 40 and 46 through etching. Next, the lead-out conductors 42a to 42d and the electrodes 56a to 56d and 58a to 58d are formed on the insulating layer 104 through photolithography. At this time, both end portions of the drive coils 40 and 46 and the corresponding end portions of the lead-out conductors 42a to 42d are physically and electrically connected.

Subsequently, as illustrated in (c) of FIG. 9, a predetermined portion of the substrate 200 is removed through anisotropic etching such that the intermediate layer 202 is reached. Next, a portion of the intermediate layer 202 which is exposed by removing the substrate 200 is removed through dry etching. Accordingly, the movable part 22 other than the mirror 48 and the insulating layer 54, the base portion 24, and the connection members 38 and 44 are formed. At this time, the insulating layer 104 becomes the insulating layers 28 and 50, and the intermediate layer 202 becomes the insulating layers 30 and 52.

Figure 10:
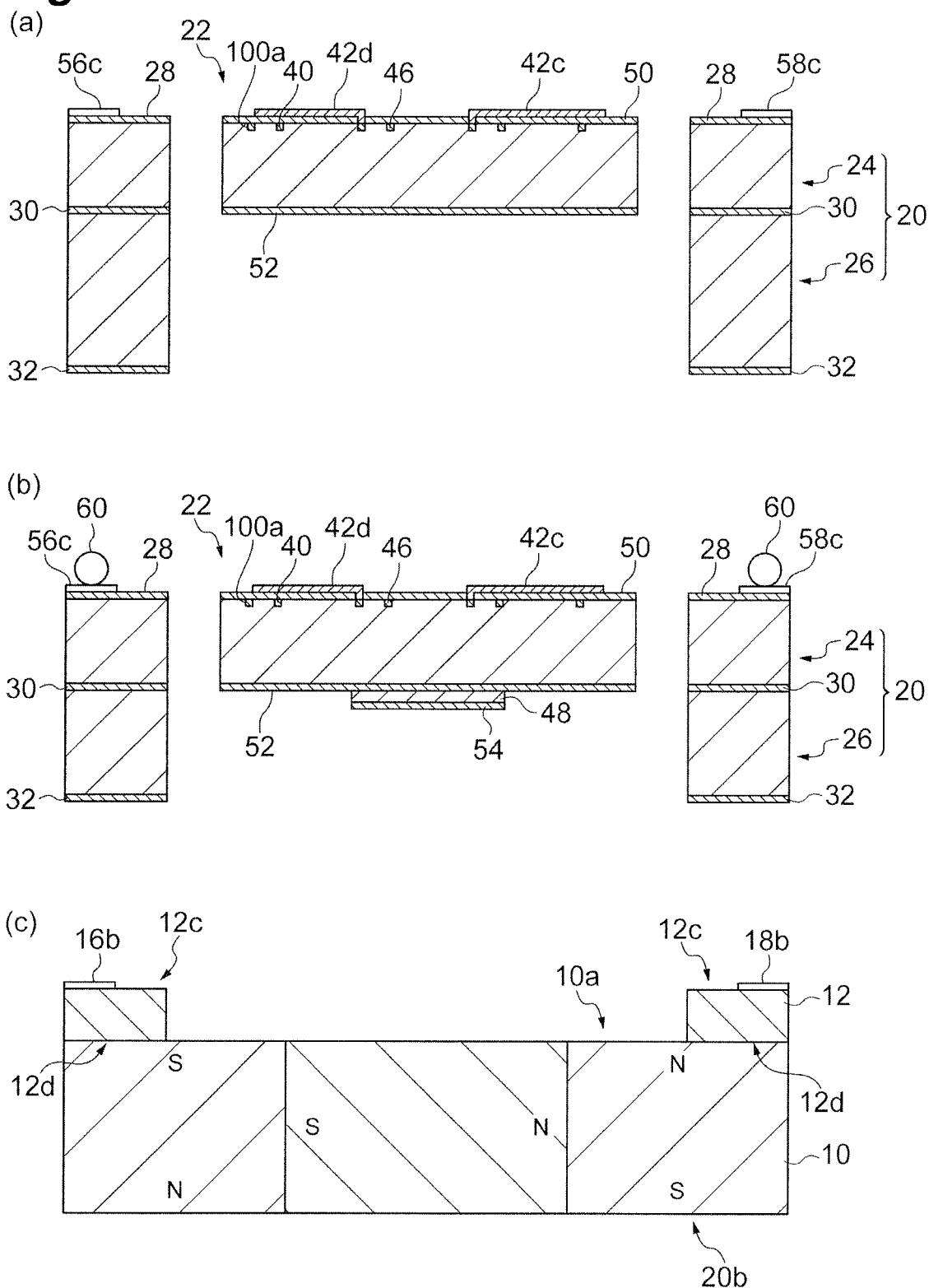
FIG. 10 is a view for explaining a process subsequent to FIG. 9.

Subsequently, as illustrated in (a) of FIG. 10, predetermined portions of the silicon oxide film 206 and the substrate 204 are removed through etching. Accordingly, the reinforcing portion 26 is formed. At this time, the silicon oxide film 206 becomes the insulating layer 32.

Subsequently, as illustrated in (b) of FIG. 10, the mirror 48 and the insulating layer 54 are formed on the insulating layer 52. Accordingly, the mirror structure 14 is formed. Next, the bump electrodes 60 are respectively connected onto the electrodes 56a to 56d and 58a to 58d.

Subsequently, as illustrated in (c) of FIG. 10, the permanent magnet 10, and the circuit board 12 in which the electrodes 16a to 16d and 18a to 18d are disposed on the surface 12c are prepared. Next, the circuit board 12 is attached onto the permanent magnet 10 with an adhesive such that the principal surface 10a of the permanent magnet 10 and the surface 12d of the circuit board 12 face each other.

Next, the mirror structure 14 is positioned on the permanent magnet 10 and the circuit board 12. At this time, the principal surface 36a of the mirror disposition portion 36 faces the principal surface 10a of the permanent magnet 10. The electrodes 56a to 56d of the support part 20 respectively face the electrodes 16a to 16d of the circuit board 12. The electrodes 58a to 58d of the support part 20 respectively face the electrodes 18a to 18d of the circuit board 12. Therefore, the circuit board 12 is positioned between the support part 20 and the permanent magnet 10 but does not overlap the movable part 22 when viewed in the Z-axis direction.

Next, the bump electrodes 60 are respectively placed on the electrodes 16a to 16d and 18a to 18d such that the bump electrodes 60 and the corresponding electrodes 16a to 16d and 18a to 18d are connected. Accordingly, the drive coils 40 and 46 are electrically connected to the circuit board 12 via the lead-out conductors 42a to 42d, the electrodes 56a to 56d and 58a to 58d, the bump electrodes 60, and the electrodes 16a to 16d and 18a to 18d. In the above manner, the permanent magnet 10, the circuit board 12 and the mirror structure 14 are assembled together and the mirror drive device 1 is completed.

In this embodiment described above, the permanent magnet 10 faces the principal surfaces 34a and 36a in the Z-axis direction. Therefore, the permanent magnet 10 and the movable part 22 become adjacent to each other in the Z-axis direction, and the permanent magnet 10 as a whole becomes close to the drive coils 40 and 46 disposed at the principal surfaces 34a and 36a side of the movable part 22. Therefore, the magnetic field acting on the drive coils 40 and 46 can be sufficiently secured.

In this embodiment, the drive coils 40 and 46 are connected to the electrodes 56a to 56d and 58a to 58d positioned at the end portion of the support part 20 close to the permanent magnet 10 by the lead-out conductors 42a to 42d that extend from the movable part 22 to the support part 20 via the connection members 38 and 44. In addition, the electrodes 56a to 56d and 58a to 58d are electrically connected to the circuit board 12 positioned between the support part 20 and the permanent magnet 10 when viewed in the Z-axis direction. As described above, since the circuit board 12 is present between the support part 20 and the permanent magnet 10, electrical connection between the electrodes 56a to 56d and 58a to 58d positioned at the end portion (the surface 20a) of the support part 20 close to the permanent magnet 10 and the circuit board 12 is achieved. Therefore, even in a case where the drive coils 40 and 46 are disposed at the surface (the principal surface 36a) of the movable part 22 on the side opposite to the mirror 48, it becomes possible to electrically connect the drive coils 40 and 46 to the outside.

In this embodiment, although the circuit board 12 is disposed on the principal surface 10a of the permanent magnet 10 when viewed in the Z-axis direction, the circuit board 12 does not overlap the movable part 22. Therefore, the circuit board 12 positioned between the support part 20 and the permanent magnet 10 functions as a spacer for separating the movable part 22 and the permanent magnet 10 from each other. Therefore, a space where the movable part 22 is oscillated can be secured by the circuit board 12. Furthermore, since the circuit board 12 has both its original function of supplying electricity to the drive coils 40 and 46 and the function as the spacer, a reduction in the overall size of the mirror drive device 1 can be achieved.

Causing a portion of the permanent magnet 10 that overlaps the support part 20 in the Z-axis direction to protrude toward the support part 20 and thus causing the permanent magnet 10 to be provided with a function as a spacer may be considered. In this case, the shape of the permanent magnet 10 becomes complex and the magnetic field formed in the periphery of the movable part 22 by the permanent magnet 10 becomes complex. Therefore, it becomes difficult to position the drive coil 40 in a region where the magnetic flux density of the magnetic field shows the substantially maximum value. However, in this embodiment, since the circuit board 12 has a function as the spacer and the principal surface 10a of the permanent magnet 10 has a flat surface shape, the region where the magnetic flux density of the magnetic field formed in the periphery of the movable part 22 by the permanent magnet 10 shows the substantially maximum value can be easily specified. Therefore, it becomes easy to position the drive coil 40 in the region.

In this embodiment, the electrodes 56a to 56d and 58a to 58d are disposed at positions of the base portion 24, the positions being on the surface side facing the permanent magnet 10 and overlapping the reinforcing portion 26 when viewed in the facing direction. Therefore, when stress or the like is generated when the circuit board 12 is electrically connected to the drive coils 40 and 46, the reinforcing portion 26 primarily receives the stress or the like via the electrodes 56a to 56d and 58a to 58d and the base portion 24. Therefore, the movable part 22 is less likely to be affected by the stress or the like.

In this embodiment, the thickness of the support part 20 is greater than the thickness of the movable part 22 in the Z-axis direction. Therefore, the strength of the support part 20 increases, and even though stress or the like is generated when the circuit board 12 is electrically connected to the drive coils 40 and 46, the movable part 22 is even less likely to be affected by the stress or the like. Therefore, breaking of the movable part 22 can be prevented.

In this embodiment, the bump electrodes 60 are disposed between the circuit board 12 and thee support part 20, and the electrodes 16a to 16d and 18a to 18d of the circuit board 12 and the electrodes 56a to 56d and 58a to 58d of the support part 20 are electrically connected. In this case, since the bump electrodes 60 are present between the permanent magnet 10 and the support part 20, the clearance between the principal surface 36a of the mirror disposition portion 36 and the permanent magnet 10 is further increased. Therefore, a space where the movable part 22 is oscillated can be further secured.

In this embodiment, the coating layer 102 covers the opening of the groove portion 100a. In addition, the metallic material forming the coating layer 102 has a function of suppressing the diffusion of the metallic material forming the drive coil 46. Therefore, the metallic materials forming the drive coils 40 and 46 are less likely to diffuse toward the insulating layer 104, and the occurrence of a short circuit is prevented. Therefore, conduction failure caused by a short circuit is prevented. Accordingly, the drive coils 40 and 46 which are wound at a high density are realized, and a higher Lorentz force can be exerted on the drive coils 40 and 46. As a result, the mirror drive device 1 having the mirror 48 with a large movable range can be obtained.

In this embodiment, the metallic material forming the drive coil 46 is Cu or Au, and the metallic material forming the coating layer 102 is Al or an alloy containing Al. Cu or Au is a material that has low electrical resistivity and is relatively easily diffusible, but the diffusion of such a material can be suppressed by the presence of the coating layer 102. Particularly, since the metallic material forming the coating layer 102 is Al or an alloy containing Al, the diffusion of Cu or Au is extremely suppressed. Therefore, while reducing the electrical resistivity of the drive coils 40 and 46, the occurrence of a short circuit can be prevented.

In this embodiment, before the permanent magnet 10, the circuit board 12 and the mirror structure 14 are assembled together, the circuit board 12 is attached onto the permanent magnet 10 by an adhesive. In this case, during the production of the mirror drive device 1, the mirror structure 14 may be placed on the circuit board 12 so that the support part 20 overlaps the circuit board 12. Therefore, during the production of the mirror drive device 1, substantially no load is exerted on the mirror 48 having low strength. Therefore, the mirror 48 is less likely to be broken during the production process of the mirror drive device 1, resulting in an increase in yield.

In this embodiment, the outside portion 34 is attached to the base portion 24 of the support part 20 so as to be oscillated, via the pair of connection members 38 which are arranged on the same straight line, and the mirror disposition portion 36 is attached to the outside portion 34 so as to be oscillated, via the pair of connection members 44 which are arranged on the same straight line. The arrangement direction of the pair of connection members 44 is substantially perpendicular to the arrangement direction of the pair of connection members 38 when viewed in the Z-axis direction, and thus the outside portion 34 and the mirror disposition portion 36 are oscillated about different axes of oscillation. Therefore, reflected light from the mirror 48 can be two-dimensionally scanned.

When the reflected light from the mirror 48 is two-dimensionally scanned, rapidly oscillating the mirror disposition portion 36 in order to scan the reflected light at a high speed in a first scanning direction, and oscillating the outside portion 34 at a greater swing angle than that of the mirror disposition portion 36 in order to intermittently scan the reflected light along a second scanning direction which intersects (for example, is substantially perpendicular to) the first scanning direction may be considered. At this time, in this embodiment, the drive coil 40 has a portion that is positioned in a region in which the magnetic flux density in the magnetic field formed in the periphery of the movable part 22 by the set of the magnetic poles 10A1 and 10B1 and the set of the magnetic poles 10B2 and 10C2 on the principal surface 10a side of the permanent magnet 10 shows the substantially maximum value. Therefore, while reducing the current flowing through the drive coil 40 disposed in the outside portion 34, the Lorentz force exerted on the drive coil 40 can be increased. Therefore, it becomes possible to achieve low power consumption while increasing the swing angle of the outside portion 34.

In this embodiment, the drive coil 40 has a portion that is positioned in a region in which the magnetic flux density in the magnetic field formed in the periphery of the movable part 22 by the magnetic portions 10A to 10C forming the Halbach array shows the substantially maximum value when viewed in the Z-axis direction. Therefore, the magnetic flux density in the vicinity of the drive coil 40 is further increased by the magnetic portions 10A to 10C forming the Halbach array.

Figure 11:
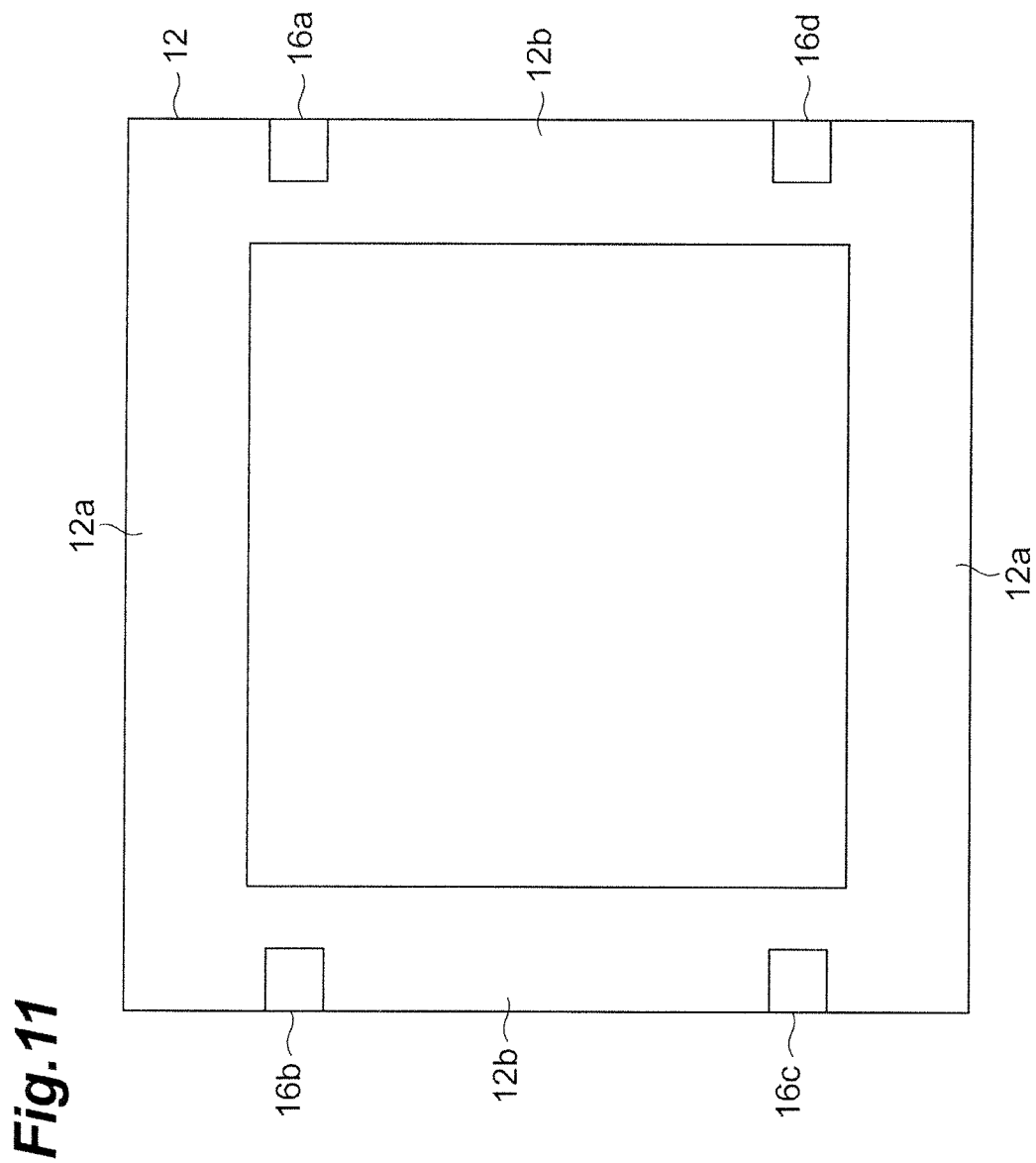
FIG. 11 is a plan view illustrating an upper surface side of a circuit board according to another example.
Figure 12:
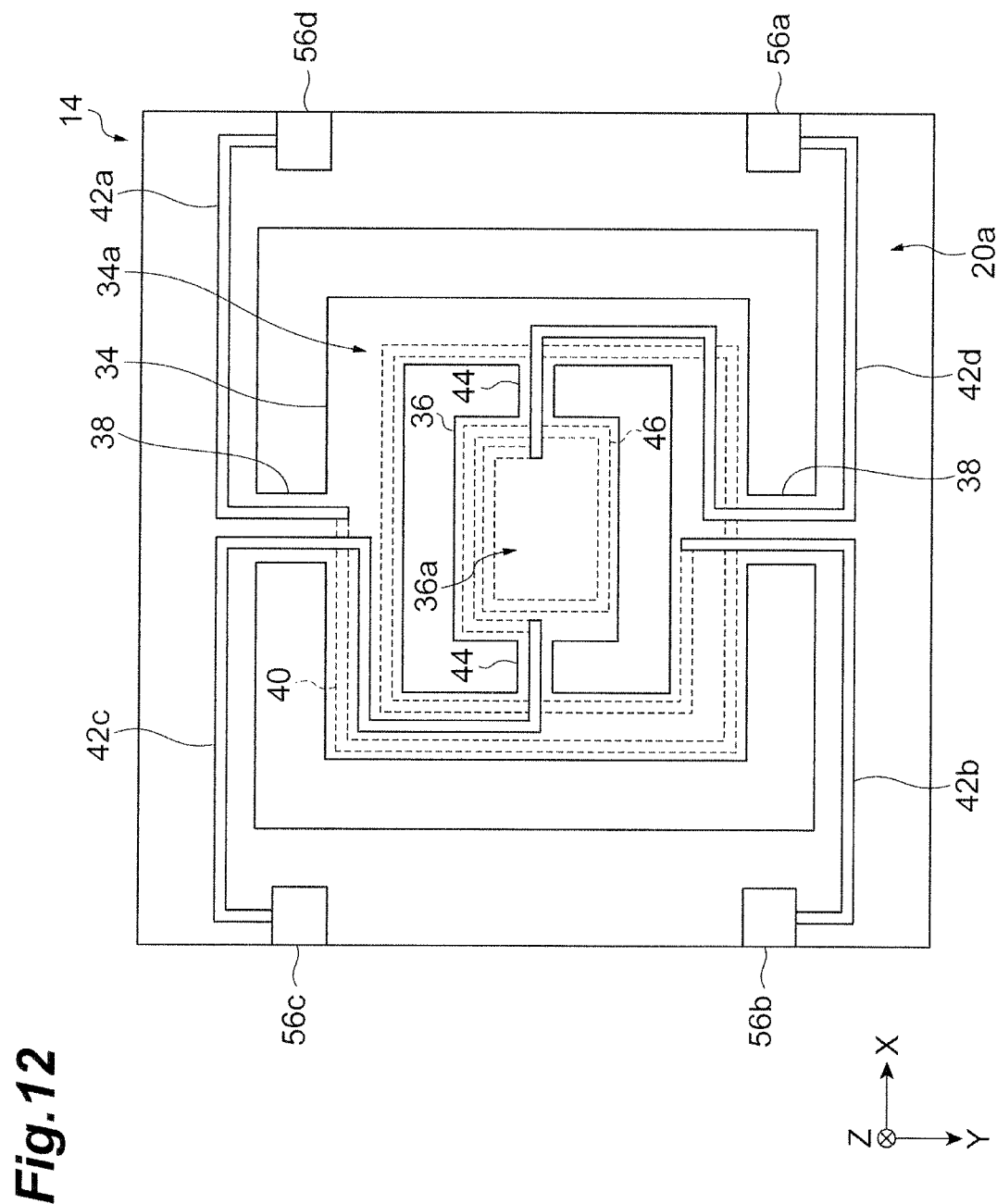
FIG. 12 is a plan view illustrating a lower surface side of a mirror structure according to another example.

While the embodiment of the present invention has been described in detail, various modifications may be added to the embodiment without departing from the gist of the present invention. For example, the mirror drive device 1 may not include the electrodes 18a to 18d and 58a to 58d that function as dummy electrodes. In this case, for example, as illustrated in FIG. 11, the two electrodes 16a and 16d may be disposed on the surface 12c of one of the second portions 12b of the circuit board 12, and the two electrodes 16b and 16c may be disposed on the surface 12c of the other of the second portions 12b of the circuit board 12. At this time, as illustrated in FIG. 12, the electrodes 56a to 56d disposed on the surface 20a of the support part 20 are disposed at positions corresponding to the electrodes 16a to 16d. As described above, when the electrodes 16a to 16d and 56a to 56d are disposed without being inclined toward one side, the mirror structure 14 is prevented from being inclined with respect to the permanent magnet 10 and the circuit board 12 in a case where the mirror structure 14 is disposed on the permanent magnet 10 and the circuit board 12.

Although not illustrated, the two electrodes 16a and 16d may also be disposed on the surface 12c of one of the first portions 12a of the circuit board 12, and the two electrodes 16b and 16c may also be disposed on the surface 12c of the other of the first portions 12a of the circuit board 12. Similarly, although not illustrated, the electrodes 16a to 16d may be respectively disposed in the portions 12a and 12b of the circuit board 12 one by one. Even in this case, the electrodes 56a to 56d disposed on the surface 20a of the support part 20 are disposed at positions corresponding to the electrodes 16a to 16d.

The shape of the circuit board 12 may not be annular. For example, as illustrated in FIG. 13, the circuit board 12 may also be constituted by two members 12A and 12B. Both the members 12A and 12B illustrated in (a) of FIG. 13 have a C shape. Both the members 12A and 12B illustrated in (b) of FIG. 13 have a straight line shape. That is, in this specification, "frame-like" includes not only an endless annular frame member but also a set of members constituted by a plurality of portions formed by cutting at least a portion of the endless annular frame member. The frame-like circuit board 12 may extend along the peripheral edge of the permanent magnet 10.

As illustrated in FIG. 13, the electrodes 16a to 16d are disposed on the surface 12c of the member 12A. The electrodes 18a to 18d are disposed on the surface 12c of the member 12B. The circuit board 12 may be constituted by three or more members. Even in a case where the circuit board 12 is constituted by a plurality of members, the circuit board 12 is positioned between the support part 20 and the permanent magnet 10 and is not positioned between the movable part 22 and the permanent magnet 10. Accordingly, a space where the movable part 22 is oscillated can be provided between the movable part 22 and the permanent magnet 10, and the oscillation of the movable part 22 is not impeded by the circuit board 12.

The two members 12A and 12B illustrated in FIG. 13 are arranged in one direction (X-axis direction) perpendicular to the facing direction (Z-axis direction) of the principal surface of the movable part 22 and may also extend in the other direction (Y-axis direction) perpendicular to both the Z-axis direction and one direction (X-axis direction). A plurality of the electrodes 16a to 16d disposed on the member 12A oppose a plurality of the electrodes 18a to 18d disposed on the member 12B in the X-axis direction, respectively. The electrodes 16a to 16d are arranged in the Y-axis direction. The electrodes 18a to 18d are arranged in the Y-axis direction. Even in this case, a space where the movable part 22 is oscillated can be provided between the members 12A and 12B forming a pair, and the oscillation of the movable part 22 is not impeded by the circuit board 12. Furthermore, the support part 20 is supported while being well-balanced, by the plurality of electrodes 16a to 16d and 18a to 18d forming pairs in a first direction. As long as a pair of portions or members that oppose each other in the X-axis direction and extend in the Y-axis direction are provided, even in a case of an endless annular frame member or even in a case of a set of members constituted by a plurality of portions formed by cutting at least a portion of the endless annular frame member, the corresponding effects are exhibited. In addition, even in a case where the electrode is a dummy electrode, the corresponding effects are exhibited.

The base portion 24 or the reinforcing portion 26 other than the circuit board 12 may have a frame-like shape, or the support part 20 as a whole may have a frame-like shape. Even in this description, "frame-like" includes not only an endless annular frame member but also a set of members constituted by a plurality of portions formed by cutting at least a portion of the endless annular frame member.

Figure 14:
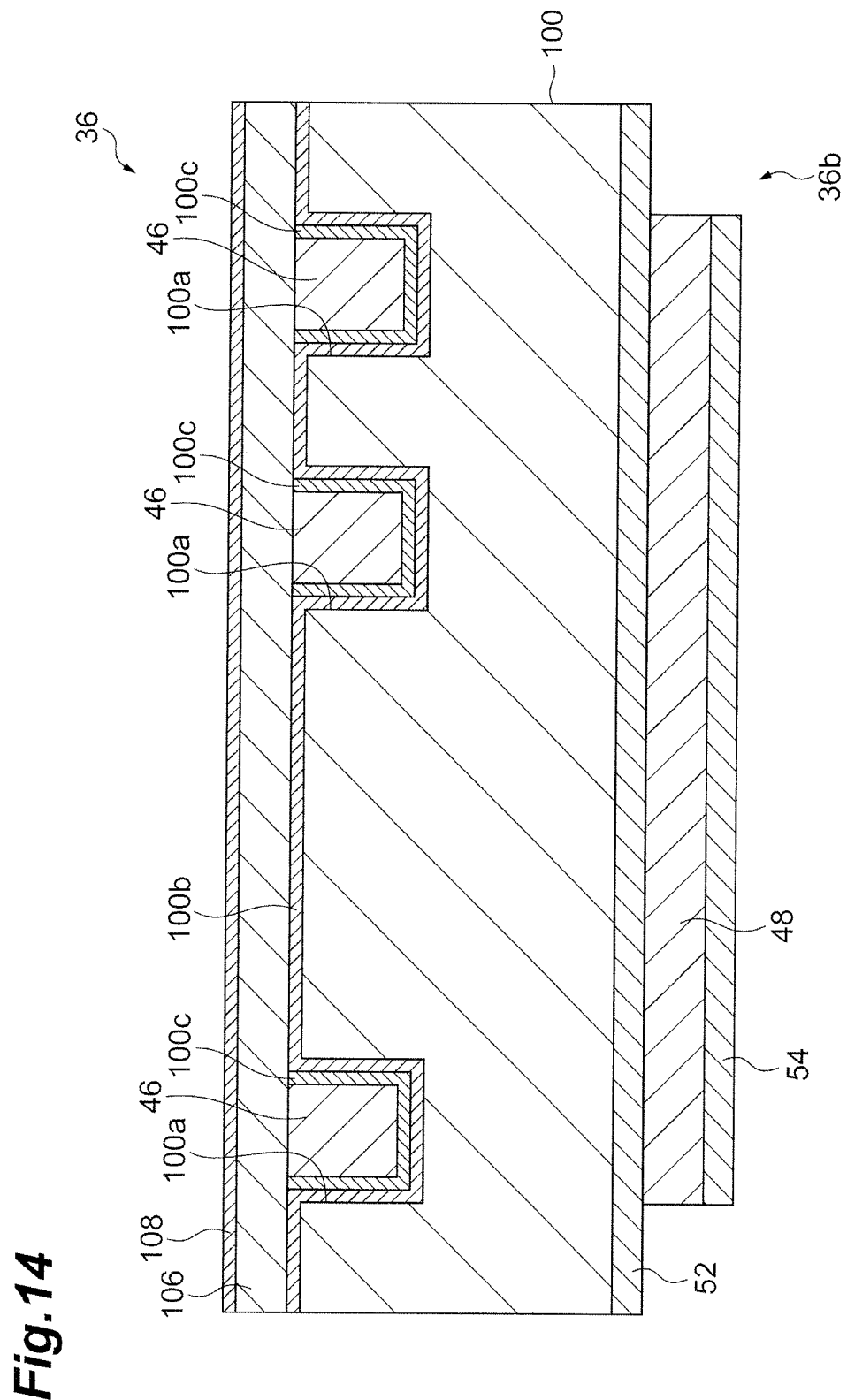
FIG. 14 is a sectional view illustrating another example of a configuration in the vicinity of a drive coil.

Regarding the structure of the vicinity of the drive coils 40 and 46, for example, as illustrated in FIG. 14, the entire surface of the base member 100 may be covered with insulating layers 106 and 108 instead of covering the opening of the groove portion 100a with the coating layer 102. The insulating layer 106 may be formed of, for example, SiN. The thickness of the insulating layer 106 may be set to, for example, about 50 nm or greater. The thickness of the insulating layer 106 may be set to, for example, about 500 nm or smaller. In this case, the diffusion of the metallic material forming the drive coil 46 is suppressed by the insulating layer 106. The insulating layer 108 may be formed of, for example, $SiO_2$. The thickness of the insulating layer 108 may be set to, for example, about 500 nm or greater.

Figure 15:
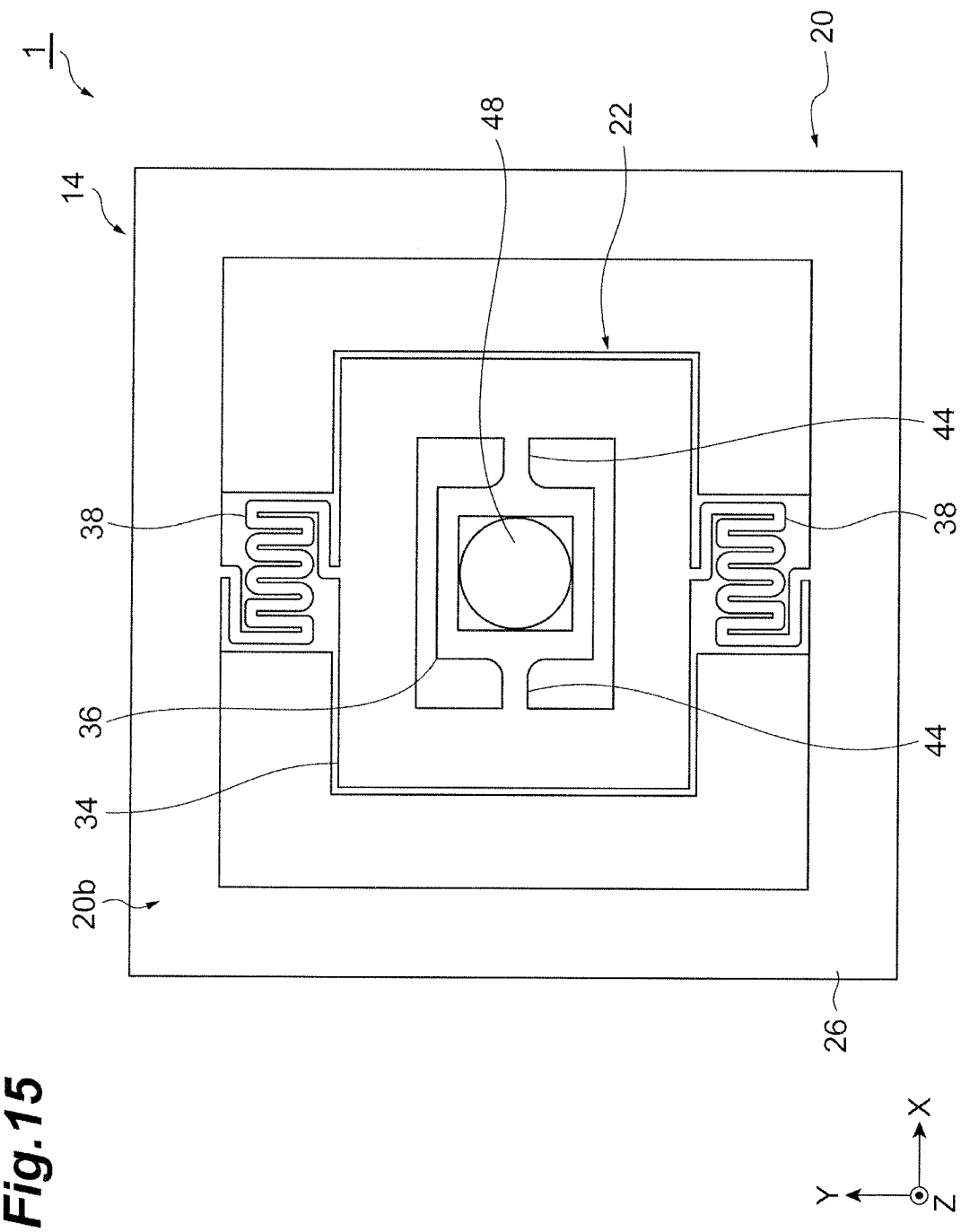
FIG. 15 is a plan view illustrating an upper surface side of a minor structure according to another example.
Figure 16:
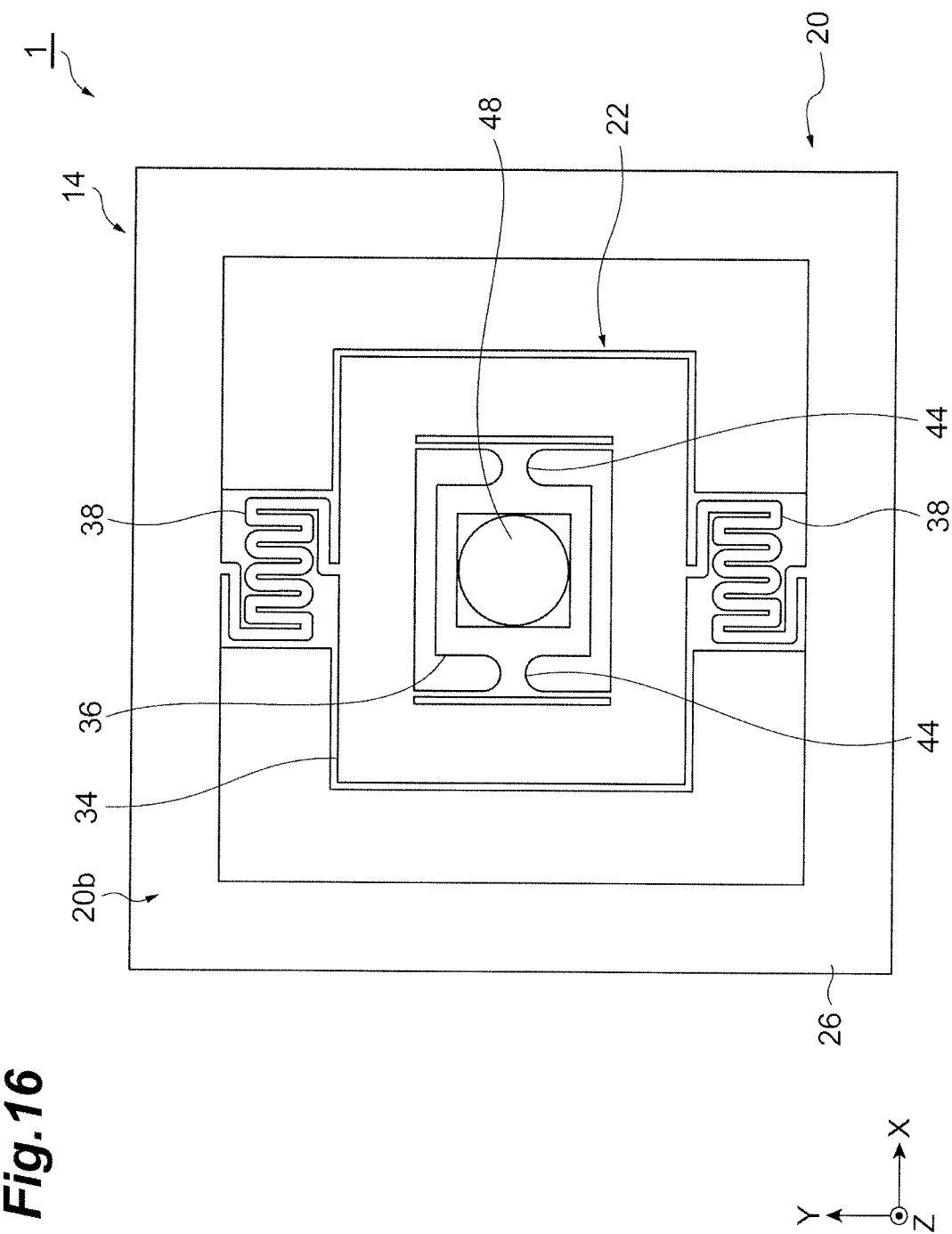
FIG. 16 is a plan view illustrating an upper surface side of a mirror structure according to another example.
Figure 17:
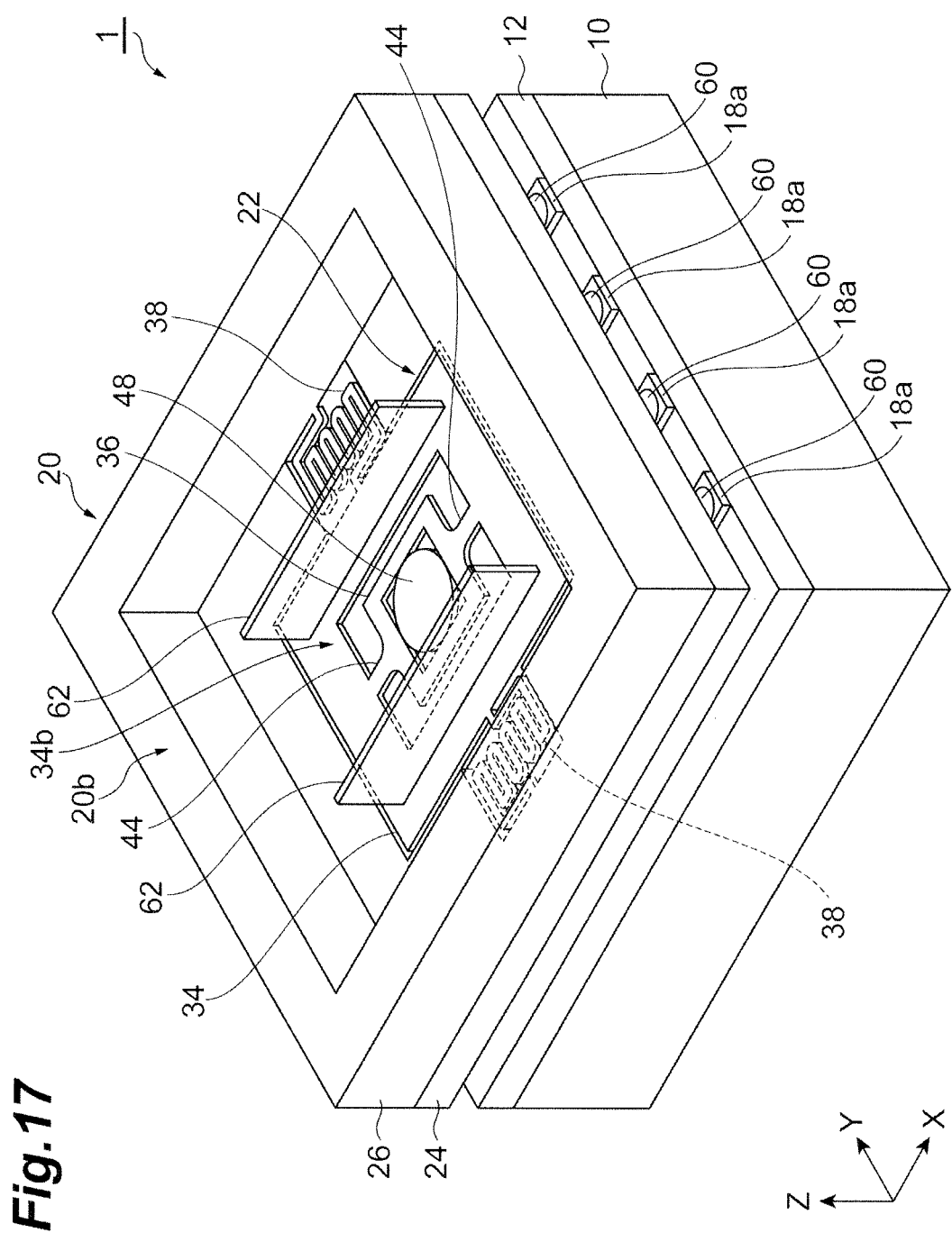
FIG. 17 is a perspective view illustrating a mirror drive device provided with a minor structure according to another example.

In this embodiment, the connection member 38 having a straight line shape is described as an example. However, the configuration of the connection member 38 is not limited thereto and may have another shape. As another example of the connection member 38, a connection member 38 having a meandering shape is illustrated in FIGS. 15 to 17. Here, as illustrated in FIG. 16, a connection member 44 may extend toward the outside portion 34 in a straight line shape along the X-axis direction, branch off into two parts, and then extend along the Y-axis direction. In this case, the length of the connection member 44 in the X-axis direction may be shortened.

As illustrated in FIG. 17, a pair of beam members 62 may be disposed on the principal surface 34b of the outside portion 34. In FIG. 17, the beam members 62 are projections extending along the arrangement direction of the pair of connection members 44 (a straight line perpendicular to the straight line on which the pair of connection members 38 are arranged) when viewed in the Z-axis direction. The height of the beam member 62 may be set to be equal to the height of the reinforcing portion 26. In this case, a load generated in the outside portion 34 due to the oscillation of the mirror disposition portion 36 is supported by the beam members 62, and thus flexure of the outside portion 34 can be suppressed. As a result, an improvement in the strength of the outside portion 34 is achieved. In addition, as long as an improvement in the strength of the outside portion 34 is achieved, the shape of the beam member 62 may not be an elongated shape like the projection. That is, the beam member 62 may not extend from the vicinity of one end of the outside portion 34 to the vicinity of the other end thereof in the arrangement direction of the pair of connection members 44. For example, in the arrangement direction of the pair of connection members 44, a plurality of the beam members 62 may be arranged in a state of being separated from each other.

As long as an intense magnetic field is formed in the vicinity of the movable part 22 on the principal surface 10a side of the permanent magnet 10, the permanent magnet 10 may not be constituted by the magnetic portions 10A to 10C forming the Halbach array. The permanent magnet 10 according to another example will be described with reference to FIGS. 18 to 21. The permanent magnet 10 according to the other example includes magnetic portions 10F to 10L.

The magnetic portions 10F and 10G are adjacent to each other along the first direction (X-axis direction) perpendicular to the facing direction (Z-axis direction) of the principal surface of the movable part 22. The magnetic portions 10K and 10L are adjacent to each other along the first direction (X-axis direction). The magnetic portions 10H, 10J, and 10I are arranged in this order so as to be adjacent to each other along a second direction (Y-axis direction) perpendicular to both the facing direction and the first direction.

The magnetic portions 10H to 10J are positioned between the magnetic portions 10G and 10K in the first direction and are interposed between the magnetic portions 10G and 10K. Therefore, the magnetic portions 10H to 10J are adjacent to the magnetic portions 10G and 10K in the first direction.

A boundary surface 10M is formed by a surface where the magnetic portions 10F and 10G are in contact with each other. A boundary surface 10N is formed by a surface where the magnetic portion 10G and the magnetic portions 10H to 10J are in contact with each other. A boundary surface 10O is formed by a surface where the magnetic portions 10H and 10J are in contact with each other. A boundary surface 10P is formed by a surface where the magnetic portions 10I and 10J are in contact with each other. A boundary surface 10Q is formed by a surface where the magnetic portion 10K and the magnetic portions 10H to 10J are in contact with each other. A boundary surface 10R is formed by a surface where the magnetic portions 10K and 10L are in contact with each other. The boundary surfaces 10M, 10N, 10Q and 10R are substantially perpendicular to the X-axis direction. The boundary surfaces 10O and 10P are substantially perpendicular to the Y-axis direction.

As illustrated in (a) of FIG. 19 and FIG. 21, the magnetic portion 10F has magnetic poles 10F1 and 10F2 having different polarities. The magnetic pole 10F1 is an N pole and is positioned at the principal surface 10a side. The magnetic pole 10F2 is an S pole and is positioned at the principal surface 10b side. That is, a magnetization direction of the magnetic portion 10F is directed from the principal surface 10b side toward the principal surface 10a side.

As illustrated in (a) of FIG. 19 and FIG. 21, the magnetic portion 10G has magnetic poles 10G1 and 10G2 having different polarities. The magnetic pole 10G1 is an S pole and is positioned at the principal surface 10a side. The magnetic pole 10G2 is an N pole and is positioned at the principal surface 10b side. That is, a magnetization direction of the magnetic portion 10G is directed from the principal surface 10a side toward the principal surface 10b side.

As illustrated in (a) of FIG. 20 and (b) of FIG. 21, the magnetic portion 10H has magnetic poles 10H1 and 10H2 having different polarities. The magnetic pole 10H1 is an S pole and is positioned at the principal surface 10a side. The magnetic pole 10H2 is an N pole and is positioned at the principal surface 10b side. That is, a magnetization direction of the magnetic portion 10H is directed from the principal surface 10a side toward the principal surface 10b side.

As illustrated in (a) of FIG. 20 and (a) of FIG. 21, the magnetic portion 10I has magnetic poles 10I1 and 10I2 having different polarities. The magnetic pole 10I1 is an N pole and is positioned at the principal surface 10a side. The magnetic pole 10I2 is an S pole and is positioned at the principal surface 10b side. That is, a magnetization direction of the magnetic portion 10I is directed from the principal surface 10b side toward the principal surface 10a side.

As illustrated in (a) of FIG. 19 and (a) of FIG. 20, the magnetic portion 10J is not magnetized. Therefore, magnetic moments in the magnetic portion 10J cancel each other, and the degree of magnetization of the magnetic portion 10J becomes substantially 0.

As illustrated in (a) of FIG. 19 and FIG. 21, the magnetic portion 10K has magnetic poles 10K1 and 10K2 having different polarities. The magnetic pole 10K1 is an N pole and is positioned at the principal surface 10a side. The magnetic pole 10K2 is an S pole and is positioned at the principal surface 10b side. That is, a magnetization direction of the magnetic portion 10K is directed from the principal surface 10b side toward the principal surface 10a side.

As illustrated in (a) of FIG. 19 and FIG. 21 the magnetic portion 10L has magnetic poles 10L1 and 10L2 having different polarities. The magnetic pole 10L1 is an S pole and is positioned at the principal surface 10a side. The magnetic pole 10L2 is an N pole and is positioned at the principal surface 10b side. That is, a magnetization direction of the magnetic portion 10L is directed from the principal surface 10a side toward the principal surface 10b side.

As described above, in the principal surface 10a, a set of the magnetic pole 10F1 (N pole) and the magnetic pole 10G1 (S pole) which are arranged to be adjacent to each other in the first direction is exhibited. In the principal surface 10a, a set of the magnetic pole 10K1 (N pole) and the magnetic pole 10L1 (S pole) which are arranged to be adjacent to each other in the first direction is exhibited. Therefore, an intense magnetic field is formed in the vicinity of the movable part 22 on the principal surface 10a side of the permanent magnet 10. As illustrated in (b) of FIG. 19, the magnetic flux density in the magnetic field is particularly high in the vicinity of the boundary (the boundary surface 10M) between the magnetic poles 10F1 and 10G1 forming a set on the principal surface 10a side of the permanent magnet 10 in the first direction (X-axis direction) and in the vicinity of the boundary (the boundary surface 10R) between the magnetic poles 10K1 and 10L1 forming a set on the principal surface 10a side of the permanent magnet 10 in the first direction (X-axis direction), and tends to decrease as the distance from the boundaries increases. In addition, as illustrated in (b) of FIG. 20, the magnetic flux density in the magnetic field is particularly high in between the magnetic poles 10H1 and 10I1 (the magnetic portion 10J) on the principal surface 10a side of the permanent magnet 10 in the second direction (Y-axis direction), and tends to decrease as the distance from the magnetic portion 10J increases.

Even in a case where the permanent magnet 10 according to the other example described above is used, the drive coil 40 has a portion that is positioned in a first region in which the magnetic flux density in the magnetic field formed in the periphery of the movable part 22 by the magnetic portions 10F to 10L shows the substantially maximum value. Therefore, a relatively high magnetic flux density can be formed in the vicinity of the drive coil 40 by the magnetic portions 10F to 10L arranged in a specific state.

On the other hand, in a case where the permanent magnet 10 according to the other example described above is used, the drive coil 46 has a portion that is positioned in a second region different from the first region. In other words, the drive coil 46 is disposed between the boundary surfaces 10M and 10R when viewed in the facing direction. In a case where a current at a frequency corresponding to the resonant frequency of the mirror disposition portion 36 is caused to flow through the drive coil 46 and reflected light is scanned at a high speed along the first scanning direction, the mirror disposition portion 36 is oscillated due to resonance. Therefore, a high Lorentz force does not need to be exerted on the drive coil 46 in order to oscillate the mirror disposition portion 36. Therefore, when the drive coil 46 has the portion positioned in the second region, the drive coil 40 is easily positioned in the first region. Therefore, the Lorentz force exerted on the drive coil 40 can be further increased.

The permanent magnet 10 according to the other example described above includes the magnetic portion 10J which is not magnetized. However, the magnetic portion 10J may not be included as illustrated in FIG. 22. In this case, the magnetic portions 10H and 10I are adjacent to each other along the second direction (Y-axis direction), and a boundary surface 10S is formed by a surface where the magnetic portions 10H and 10I are in contact with each other.

The shape of the mirror 48 may be a circular or polygonal shape (for example, quadrangular or octagonal shape).

Examples of the shape of the bump electrode 60 include a spherical shape, a hemispherical shape, a columnar shape, a pyramidal shape, and a shape obtained by partially cutting these shapes.

The permanent magnet 10 may also be obtained by magnetizing a ferromagnetic body or a ferrimagnetic body.

The circuit board 12 may not be directly placed on the principal surface 10a of the permanent magnet 10 as long as the circuit board 12 is disposed between the support part 20 and the permanent magnet 10. Even in this case, the circuit board 12 positioned between the support part 20 and the permanent magnet 10 functions as a spacer for separating the movable part 22 and the permanent magnet 10 from each other. Therefore, a space where the movable part 22 is oscillated can be secured by the circuit board 12.

In the production process of the mirror drive device 1, the mirror 48 may be formed after the drive coils 40 and 46 are formed.

In the production process of the minor drive device 1, the permanent magnet 10, the circuit board 12 and the mirror structure 14 may be assembled together in a different order from that in the above-described embodiment. For example, first, the bump electrodes 60 are respectively connected onto the electrodes 56a to 56d and 58a to 58d of the obtained mirror structure 14 one by one. Next, the circuit board 12 which is not attached to the permanent magnet 10 is prepared, and the electrodes 16a to 16d and 18a to 18d of the circuit board 12 are respectively connected to the bump electrodes 60. Next, the surface 12d of the circuit board 12 is connected to the principal surface 10a of the permanent magnet 10 by an adhesive or the like.

Electrical connection between the electrodes 16a to 16d and 18a to 18d and the electrodes 56a to 56d and 58a to 58d is not limited to the bump electrodes 60, and for example, a conductive adhesive film may also be used.

REFERENCE SIGNS LIST

1 MIRROR DRIVE DEVICE
10 PERMANENT MAGNET
10A to 10C MAGNETIC PORTION
10a, 10b PRINCIPAL SURFACE
12 CIRCUIT BOARD
14 MIRROR STRUCTURE
16a to 16d ELECTRODE
18a to 18d ELECTRODE
20 SUPPORT PART
22 MOVABLE PART
24 BASE PORTION
26 REINFORCING PORTION
36 MIRROR DISPOSITION PORTION
36a, 36b PRINCIPAL SURFACE
38, 44 CONNECTION MEMBER
40, 46 DRIVE COIL
42a to 42d LEAD-OUT CONDUCTOR
48 MIRROR
56a to 56d ELECTRODE
58a to 58d ELECTRODE
60 BUMP ELECTRODE
100 BASE MEMBER
100a GROOVE PORTION
102 COATING LAYER
104 INSULATING LAYER

The invention claimed is:
1. A mirror drive device comprising:
a support part having a frame-like shape;
a movable part positioned at an inside of the support part, having a first principal surface and a second principal surface located on opposite sides, and supported by the support part so as to be oscillated via a first connection member;
a magnetic body positioned to face the support part and the second principal surface in a direction in which the first principal surface and the second principal surface are arranged and forming a magnetic field in the periphery of the movable part; and
a circuit board having a frame-like shape and disposed between the support part and the magnetic body in the direction so as to cause the movable part to be disposed at an inside of the circuit board when viewed in the direction,
wherein the movable part includes:
a base member including the first principal surface and the second principal surface,
a mirror disposed at the first principal surface side, and
at least one drive coil disposed at the second principal surface side so as to face the magnetic body,
wherein the support part includes:
a base portion having a frame-like shape and connected to the first connection member,
a reinforcing portion having a frame-like shape and extending from the base portion toward a side away from the magnetic body and the circuit board in the direction, and
an electrode disposed at a position of the base portion, the position being on a surface side facing the magnetic body and overlapping with the reinforcing portion when viewed in the direction,
wherein the drive coil is connected to the electrode by a lead-out conductor extending from the movable part to the support part via the first connection member,
wherein the electrode is electrically connected to the circuit board,
wherein the movable part includes:
a mirror disposition portion including a portion where the mirror is disposed in the base member, and
an outside portion including a frame-like portion surrounding an outer periphery of the mirror disposition portion in the base member,
wherein the at least one drive coil includes the two drive coils,
wherein the outside portion is supported by the support part so as to be oscillated via the first connection member,
wherein the mirror disposition portion is supported by the outside portion so as to be oscillated via a second connection member extending in a direction intersecting the first connection member,
wherein each of the two drive coils is wound in a spiral shape when viewed in a direction perpendicular to the second principal surface,
wherein a first drive coil of the two drive coils is disposed at the second principal surface side in the mirror disposition portion,
wherein a second drive coil of the two drive coils is disposed at the second principal surface side in the outside portion,
wherein in a surface of the magnetic body, the surface facing the second principal surface, a set of magnetic poles constituted by an S pole and an N pole arranged to be adjacent to each other in a direction along the surface is exhibited, and
wherein the second drive coil has a portion positioned in a first region in which a magnetic flux density in the magnetic field formed in the periphery of the movable part by the set of magnetic poles shows the substantially maximum value.

2. The mirror drive device according to claim 1, wherein the circuit board is disposed at a surface of the magnetic body, the surface facing the second principal surface.

3. The mirror drive device according to claim 1, wherein, in the direction, a sum of thicknesses of the base portion and the reinforcing portion is greater than a thickness of the movable part.

4. The mirror drive device according to claim 1, further comprising:
a bump electrode disposed between the circuit board and the support part and connecting the circuit board to the electrode.

5. The mirror drive device according to claim 1,
wherein the base member includes a groove portion disposed at the second principal surface side and extending in the spiral shape when viewed in the direction perpendicular to the second principal surface, and
wherein the drive coil is formed of a first metallic material disposed in the groove portion and is wound in the spiral shape when viewed in the direction perpendicular to the second principal surface.

6. The mirror drive device according to claim 5, wherein the movable part further includes:
a coating layer covering an opening of the groove portion and formed of a second metallic material that suppresses diffusion of the first metallic material, and
an insulating layer disposed on the second principal surface and the coating layer.

7. The mirror drive device according to claim 6,
wherein the first metallic material is Cu or Au, and
wherein the second metallic material is Al or an alloy containing Al.

8. The mirror drive device according to claim 5,
wherein the movable part further includes an insulating layer covering the opening of the groove portion.

9. The mirror drive device according to claim 8,
wherein a material forming the insulating layer is SiN, and
wherein a thickness of the insulating layer is 50 nm or greater.

10. The mirror drive device according to claim 1,
wherein the magnetic body has a first magnetic portion, a second magnetic portion and a third magnetic portion which are sequentially arranged to form a Halbach array along a predetermined direction, and
wherein the second drive coil has a portion positioned in the first region.

11. The mirror drive device according to claim 1,
wherein the magnetic body includes:
a first magnetic portion and a second magnetic portion which are adjacent to each other along a first direction perpendicular to the facing direction,
a third magnetic portion and a fourth magnetic portion which are adjacent to each other along the first direction, and
a fifth magnetic portion and a sixth magnetic portion which are arranged along a second direction perpendicular to both the facing direction and the first direction,
wherein the fifth and sixth magnetic portions are positioned between the second and third magnetic portions and are adjacent to the second and third magnetic portions in the first direction,
wherein a magnetization direction of each of the first, third and fifth magnetic portions is directed from the first principal surface side toward the second principal surface side,
wherein a magnetization direction of each of the second, fourth and sixth magnetic portions is directed from the second principal surface side toward the first principal surface side, and
wherein the second drive coil has a portion positioned in the first region.

12. The mirror drive device according to claim 11,
wherein the first drive coil has a portion positioned in a second region other than the first region.

13. A method of manufacturing a mirror drive device comprising:
preparing a circuit board having a frame-like shape;
preparing a mirror structure which includes a support part having a frame-like shape, and a movable part positioned at an inside of the support part, having a first principal surface and a second principal surface located on opposite sides, and supported by the support part so as to be oscillated via a connection member, in which the movable part includes a base member including the first principal surface and the second principal surface, a mirror disposed at the first principal surface side, and a drive coil disposed at the second principal surface side, the support part includes a base portion having a frame-like shape and connected to the connection member, a reinforcing portion having a frame-like shape and extending from the base portion in a direction from the second principal surface toward the first principal surface, and an electrode disposed at a position of the base portion, the position being on a surface side opposite to the reinforcing portion and overlapping with the reinforcing portion when viewed in the direction, and the drive coil is connected to the electrode by a lead-out conductor extending from the movable part to the support part via the connection member;
preparing a magnetic body forming a magnetic field in the periphery of the movable part, the magnetic body having a part which faces the movable part and is exposed through the inside of the circuit board when viewed in the direction;
assembling the mirror structure, a magnetic body, and a circuit board such that the magnetic body faces the support part and the second principal surface in the direction, and that the reinforcing portion, the base portion, the electrode, the circuit board, and the magnetic body overlap in this order in the direction, thereby electrically and physically connecting the circuit board to the electrode.

14. The method according to claim 13, further comprising:
disposing the circuit board on a portion of a surface of the magnetic body after the preparation of the mirror structure and before the electrical connection of the circuit board to the drive coil.

15. The method according to claim 13, further comprising:
disposing a bump electrode on the electrode after the preparation of the mirror structure and before the electrical connection of the circuit board to the drive coil,
wherein, when the circuit board and the drive coil are electrically connected to each other, the bump electrode is connected to the circuit board, thereby assembling the mirror structure and the bump electrode with the magnetic body and the circuit board.

16. A mirror drive device comprising:
a support part having a frame-like shape;
a movable part positioned at an inside of the support part, having a first principal surface and a second principal surface located on opposite sides, and supported by the support part so as to be oscillated via a first connection member;
a magnetic body positioned to face the support part and the second principal surface in a direction in which the first principal surface and the second principal surface are arranged and forming a magnetic field in the periphery of the movable part; and
a circuit board having a frame-like shape and disposed between the support part and the magnetic body in the direction so as to cause the movable part to be disposed at an inside of the circuit board when viewed in the direction,
wherein the magnetic body includes an exposed part which faces the movable part and is exposed through the inside of the circuit board when viewed in the direction,
wherein the movable part includes:
a base member including the first principal surface and the second principal surface,
a mirror disposed at the first principal surface side, and
at least one drive coil disposed at the second principal surface side so as to face the exposed part,
wherein the support part includes:
a base portion having a frame-like shape and connected to the first connection member,
a reinforcing portion having a frame-like shape and extending from the base portion toward a side away from the magnetic body and the circuit board in the direction, and
an electrode disposed at a position of the base portion, the position being on a surface side facing the magnetic body and overlapping the reinforcing portion when viewed in the direction,
wherein the reinforcing portion, the base portion, the electrode, the circuit board, and the magnetic body overlap in this order in the direction,
wherein the drive coil is connected to the electrode by a lead-out conductor extending from the movable part to the support part via the first connection member, and
wherein the electrode is electrically and physically connected to the circuit board.

17. The mirror drive device according to claim 16, wherein the circuit board is disposed at a surface of the magnetic body, the surface facing the second principal surface.

18. The mirror drive device according to claim 16, wherein, in the direction, a sum of thicknesses of the base portion and the reinforcing portion is greater than a thickness of the movable part.

19. The mirror drive device according to claim 16, further comprising a bump electrode disposed between the circuit board and the support part and connecting the circuit board to the electrode.

20. The mirror drive device according to claim 16,
wherein the base member includes a groove portion disposed at the second principal surface side and extending in a spiral shape when viewed in a direction perpendicular to the second principal surface, and
wherein the drive coil is formed of a first metallic material disposed in the groove portion and is wound in a spiral shape when viewed in the direction perpendicular to the second principal surface.

21. The mirror drive device according to claim 20,
wherein the movable part further includes:
a coating layer covering an opening of the groove portion and formed of a second metallic material that suppresses diffusion of the first metallic material, and
an insulating layer disposed on the second principal surface and the coating layer.

22. The mirror drive device according to claim 21,
wherein the first metallic material is Cu or Au, and
wherein the second metallic material is Al or an alloy containing Al.

23. The mirror drive device according to claim 20, wherein the movable part further includes an insulating layer covering the opening of the groove portion.

24. The mirror drive device according to claim 23,
wherein a material forming the insulating layer is SiN, and
wherein a thickness of the insulating layer is 50 nm or greater.

25. The mirror drive device according to claim 16,
wherein the movable part includes:
- a mirror disposition portion including a portion where the mirror is disposed in the base member, and
- an outside portion including a frame-like portion surrounding an outer periphery of the mirror disposition portion in the base member, wherein the at least one drive coil includes the two drive coils,
wherein the outside portion is supported by the support part so as to be oscillated via the first connection member,
wherein the mirror disposition portion is supported by the outside portion so as to be oscillated via a second connection member extending in a direction intersecting the first connection member,
wherein each of the two drive coils is wound in a spiral shape when viewed in a direction perpendicular to the second principal surface,
wherein a first drive coil of the two drive coils is disposed at the second principal surface side in the mirror disposition portion,
wherein a second drive coil of the two drive coils is disposed at the second principal surface side in the outside portion,
wherein in a surface of the magnetic body, the surface facing the second principal surface, a set of magnetic poles constituted by an S pole and an N pole arranged to be adjacent to each other in a direction along the surface is exhibited, and
wherein the second drive coil has a portion positioned in a first region in which a magnetic flux density in the magnetic field formed in the periphery of the movable part by the set of magnetic poles shows the substantially maximum value.

26. The mirror drive device according to claim 16,
wherein the magnetic body has a first magnetic portion, a second magnetic portion and a third magnetic portion which are sequentially arranged to form a Halbach array along a predetermined direction, and
wherein the second drive coil has a portion positioned in the first region.

27. The mirror drive device according to claim 16,
wherein the magnetic body includes:
- a first magnetic portion and a second magnetic portion which are adjacent to each other along a first direction perpendicular to the direction,
- a third magnetic portion and a fourth magnetic portion which are adjacent to each other along the first direction, and
- a fifth magnetic portion and a sixth magnetic portion which are arranged along a second direction perpendicular to both the direction and the first direction, wherein the fifth and sixth magnetic portions are positioned between the second and third magnetic portions and are adjacent to the second and third magnetic portions in the first direction,
wherein a magnetization direction of each of the first, third and fifth magnetic portions is directed from the first principal surface side toward the second principal surface side,
wherein a magnetization direction of each of the second, fourth and sixth magnetic portions is directed from the second principal surface side toward the first principal surface side, and
wherein the second drive coil has a portion positioned in the first region.

28. The mirror drive device according to claim 27, wherein the first drive coil has a portion positioned in a second region other than the first region.

* * * * *